(12) United States Patent
Lynch

(10) Patent No.: US 8,169,812 B2
(45) Date of Patent: May 1, 2012

(54) MEMORY ARCHITECTURE WITH A CURRENT CONTROLLER AND REDUCED POWER REQUIREMENTS

(76) Inventor: John K. Lynch, West Lafayette, IN (US)

( * ) Notice: Subject to any disclaimer, the term of this patent is extended or adjusted under 35 U.S.C. 154(b) by 297 days.

(21) Appl. No.: 12/706,374

(22) Filed: Feb. 16, 2010

(65) Prior Publication Data

US 2010/0315858 A1    Dec. 16, 2010

Related U.S. Application Data

(60) Provisional application No. 61/154,241, filed on Feb. 20, 2009.

(51) Int. Cl.
*G11C 7/00* (2006.01)
(52) U.S. Cl. .................. 365/149; 365/189.05
(58) Field of Classification Search .......... 365/149, 365/189.05
See application file for complete search history.

(56) References Cited

U.S. PATENT DOCUMENTS

| | | | |
|---|---|---|---|
| 5,841,695 A | 11/1998 | Wik | |
| 7,133,311 B2 | 11/2006 | Liu | |
| 7,512,026 B2* | 3/2009 | O | 365/207 |
| 7,808,809 B2* | 10/2010 | Norman | 365/63 |
| 2003/0218915 A1 | 11/2003 | Isono | |
| 2005/0117432 A1 | 6/2005 | Graaff et al. | |
| 2005/0180205 A1* | 8/2005 | Park et al. | 365/171 |
| 2006/0092743 A1 | 5/2006 | Choi et al. | |
| 2006/0146590 A1* | 7/2006 | Fukushi et al. | 365/145 |
| 2006/0221009 A1* | 10/2006 | Miwa | 345/76 |
| 2007/0019469 A1* | 1/2007 | Motoki | 365/185.03 |
| 2008/0089122 A1* | 4/2008 | O | 365/185.2 |
| 2008/0170444 A1* | 7/2008 | Hoenigschmid | 365/185.33 |
| 2008/0205119 A1* | 8/2008 | Nagai et al. | 365/148 |

* cited by examiner

*Primary Examiner* — Michael Tran
(74) *Attorney, Agent, or Firm* — Tracy Jong Law Firm; Tracy P. Jong

(57) ABSTRACT

Disclosed is a memory architecture comprising at least one memory bit cell and at least one read bit line whose voltage is controlled and changed by a current from a current controller. Each memory bit cell has a storage mechanism, a controlled current source, and a read switch. The controlled current source in each memory bit cell is electrically connected to the read bit line through the read switch. The current from the current controller that controls and changes the read bit line voltage flows through the controlled current source in the memory bit cell. The value of this current is determined by a function of a difference between the voltage on the storage mechanism in the memory bit cell and a reference voltage from a reference voltage input to the current controller. In some versions an indicator is provided for indicating when to stop the current in the controlled current source that controls a voltage change on one of the read bit lines. The indicator has an on and an off condition and a switch is provided for stopping the current in the controlled current source when the indicator is activated in the on condition. The current in the controlled current source is stopped when the voltage change on the read bit line is greater than a predetermined threshold.

40 Claims, 19 Drawing Sheets

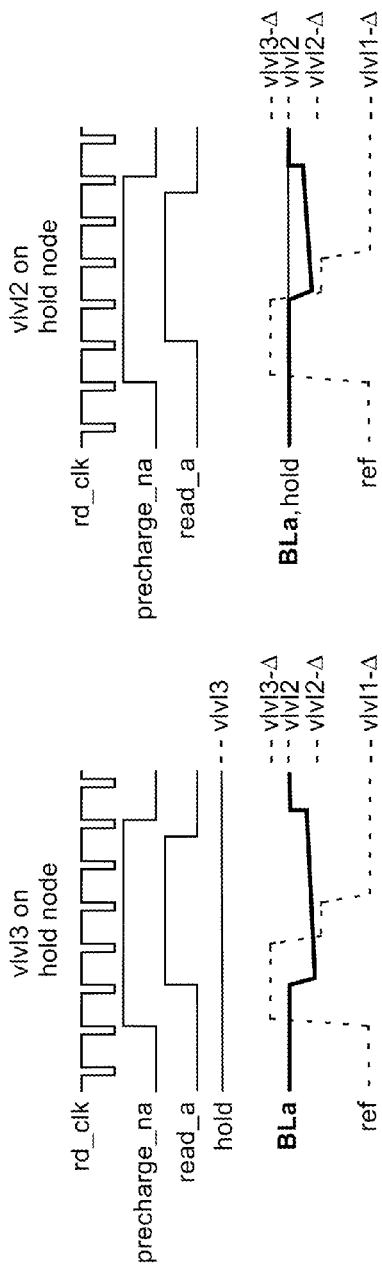
FIG. 15A
FIG. 15B
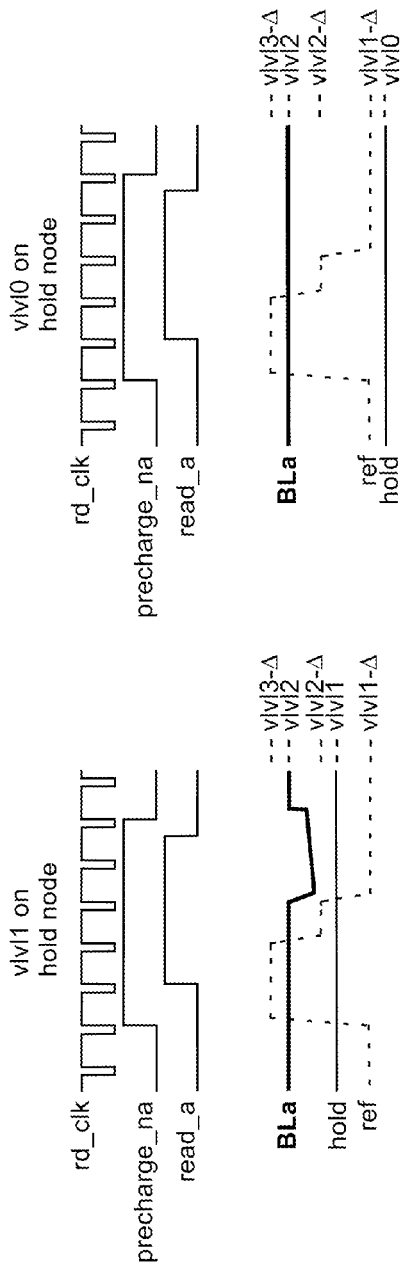
FIG. 15C
FIG. 15D

MEMORY ARCHITECTURE WITH A CURRENT CONTROLLER AND REDUCED POWER REQUIREMENTS

PRIORITY AND RELATED APPLICATIONS

This application claims the benefit of priority from provisional application U.S. Ser. No. 61/154,241 filed Feb. 20, 2009. This application is incorporated by reference herein in its entirety.

BACKGROUND OF THE INVENTION

1. Field of Invention

This invention relates to the field of solid state devices for information storage and in particular for a method and structure to solve the problem of noise sensitivity and to reduce power consumption in reading the voltage stored on a bit cell in a random access memory.

2. Background of the Related Art

Dynamic random access memory, DRAM, is a type of random access memory that stores data in bit cells within an integrated circuit. A bit cell typically includes one capacitor as the storage mechanism. Broadly speaking the read process used in DRAM technology takes the analog voltage data stored in the bit cell, translates it into a standard digital logic voltage, makes this voltage available on a bit line and interprets the voltage as the digital binary value of 0 or 1.

The first widely used architecture for DRAM used a structure that included three transistors and accordingly was commonly referred to as "3T". As technology advanced, an architecture was developed that included only one transistor to read the storage capacitor. This widely used "1T" architecture currently dominates the market. Both of these architectures have several well-known limitations and inherent drawbacks.

It has been a longstanding goal of the industry to reduce memory size. A significant reduction in size was accomplished by moving from the 3T architecture to the 1T architecture, but this change came with disadvantages. The 1T architecture needs a complicated sense amplifier and custom design work for each memory system design change. These needs increase design cycle time and manufacturing costs.

Another goal of the industry is to reduce read time. Any architecture that reduces read time is greatly desired.

Yet another longstanding goal of the industry is to reduce memory power consumption. The industry is continuously striving to reduce power consumption.

It has also been a longstanding goal of the industry to obtain increased memory capacity. One technique to increase memory capacity is to store multiple bits per storage mechanism. Neither the previously used 3T nor the more recent 1T architectures are functionally capable of meeting this need.

The 3T is limited to a single bit per storage mechanism by design. It utilizes a binary function, specifically either a voltage change or lack of voltage change on the read bit line, to indicate the value stored on the storage mechanism. The 1T is limited to a single bit per storage mechanism by functionality. It senses the voltage difference between two bit lines. This difference in voltage is small and read from a floating bit line thereby making it susceptible to noise. The noise factor makes it impractical to represent multiple bits per storage mechanism.

U.S. Pat. No. 5,841,695 to Wik (incorporated herein by reference) attempts to overcome the inherent binary limitations of the 3T by increasing the number of storage mechanisms in a bit cell from one storage mechanism to three. While the three storage mechanisms allow multi-bit storage within a single cell, the power consumption of such a system is similar to the combined power consumption of three single bit cells. Thus, practically speaking, there is no advantage.

U.S. Pat. No. 7,133,311 to Liu (incorporated herein by reference) discloses a method, based on a 1T architecture, of sensing three voltage levels representing 1.5 bits per storage mechanism however, it is limited to the noise sensitivity of the 1T architecture. In fact, U.S. Pat. No. 7,133,311 teaches away from the notion of using four levels, concluding that such arrangement would not be feasible due to increased noise.

These four goals, reduced memory size, reduced read time, reduced power consumption, and increased memory capacity constitute a long felt, ongoing and unmet need in the industry. It is desirable to develop a device and method that provides these advantages without any of the limitations of the prior art.

SUMMARY OF THE INVENTION

In accordance with the invention, a memory architecture is disclosed with improved noise sensitivity comprising at least one memory bit cell and at least one read bit line whose voltage is controlled and changed by a current from a current controller. The memory bit cell comprises a storage mechanism, a controlled current source, and a read switch. The controlled current source in the memory bit cell is electrically connected to one of the read bit lines through the read switch. The current from the current controller flows through the controlled current source and is determined by a function of a difference between the voltage on the storage mechanism in the memory bit cell and the voltage from a reference voltage input to the current controller. In addition, in some embodiments, the current in the controlled current source in the memory bit cell is stopped by an indicator responding to an indication of a voltage change on the read bit line is greater than a predetermined threshold. The function that controls the voltage on the read bit line is a gain function, thereby reducing noise sensitivity. Also, the voltage transitions on the high capacitance read bit line need be no larger than necessary to sense the state of the bit cell, thereby reducing power consumption.

The function controlling the voltage on the read bit line can use one of a plurality of reference voltage levels. With the reduced noise sensitivity from not using an attenuation function and the possibility of using a plurality of reference voltage levels to control the bit cell current, the architecture in this invention is readily disposed to the desired multiple bits per storage mechanism. Therefore, the power requirements are further decreased via a true multi-bit storage mechanism that requires a system with correspondingly fewer cells. The net effect is a structure and method that substantially reduces power consumption and is easily used in a memory system that includes other substantial advantages.

It is an object of this invention to reduce noise sensitivity.

It is another object of this invention to increase yield and reduce design cycle time and costs.

It is yet another object of this invention to significantly reduce the importance of the parasitic capacitance of the read bit line as a design parameter, allowing the use of a design compiler.

It is yet another object of this invention to cancel the uncertain effect of hold node transistor threshold voltage.

It is yet another object of this invention to perform a non-destructive read.

It is yet another object of this invention to reduce read time.

It is yet another object of this invention to eliminate large standard logic voltage transitions on the read bit line.

It is yet another object of this invention to reduce power requirements.

It is yet another object of this invention to use one or more reference signals to control the change on the read bit line.

It is yet another object of this invention to provide a multi-bit cell.

It is yet another object of this invention to reduce memory size requirements.

In general it is also an object of this invention to provide a RAM device that reduces power consumption, increases memory capacity, facilitates automated design processes, requires no additional fabrication steps, is relatively economical from the viewpoint of the designer, manufacturer, and consumer, is susceptible to low manufacturing costs with regard to labor and materials, and which accordingly is then susceptible to low prices for the consuming public, thereby making it economically available to the buying public.

Whereas there may be many embodiments of the present device, each embodiment may meet one or more of the foregoing recited objects in any combination. It is not intended that each embodiment will necessarily meet each objective.

In this respect, before explaining at least one embodiment of the device in detail, it is to be understood that the invention is not limited in its application to the details of construction and the arrangements of the components set forth in the following description or illustrated in the drawings. The present device is capable of other embodiments and of being practiced and carried out in various ways.

Particular Advantages of the Invention

The present invention provides a RAM device that reduces power consumption, increases memory capacity, reduces read access time, facilitates automated design processes, and requires no additional fabrication steps.

By employing a gain function instead of an attenuation function, noise sensitivity is reduced and a less complicated bit line amplifier is necessary. The simpler bit line amplifier increases yield and reduces design cycle time and costs. By minimizing the importance of the read bit line parasitic design parameter, a design compiler can be used, further reducing design cycle time and costs.

Cancelling the uncertain effect of hold node transistor threshold voltage by using a differential pair construct enables smaller intervals between voltages on the storage mechanism or greater signal drift before requiring a refresh. For writing, using smaller voltage intervals allows smaller amplitude voltage transitions on the write bit line, reducing power consumption. Greater allowable signal drift makes the time between refreshes for each bit cell longer, reducing power consumption.

Isolating the storage mechanism from the read bit line eliminates the need for storage mechanism restore and provides the advantage of a nondestructive read. In this way both the read time and power requirements are reduced.

Eliminating large standard logic voltage transitions on the read bit line by using an amplifying structure that senses the voltage change on the read bit line and transforms the voltage change to a binary value on a wire that is distinct from the read bit line and decoupled from the capacitance associated with the read bit line reduces power requirements.

Providing a mechanism to indicate the appropriate stop time and modifications to the structure to allow the current in the bit cell to stop at a point after the voltage change on the read bit line is deemed significant and before an inherent limit due to circuit topology is reached additionally reduces power requirements.

Using multiple reference signals to control the change on the read bit line by using a plurality of input reference levels facilitates a multi-bit cell.

Reading a value representing multiple bits from a storage mechanism reduces memory size requirements while reducing power requirements.

BRIEF DESCRIPTION OF THE DRAWINGS

The invention will be described by reference to the specification and the drawings, in which like numerals refer to like elements, and wherein:

FIGS. 15A, 15B, 15C, and 15D depict a set of timing graphs depicting waveforms illustrating the read process for an embodiment including a modified differential pair working in a multi-bit per bit cell mode with the benefits of the current stopping mechanism illustrated.

Figure 1:
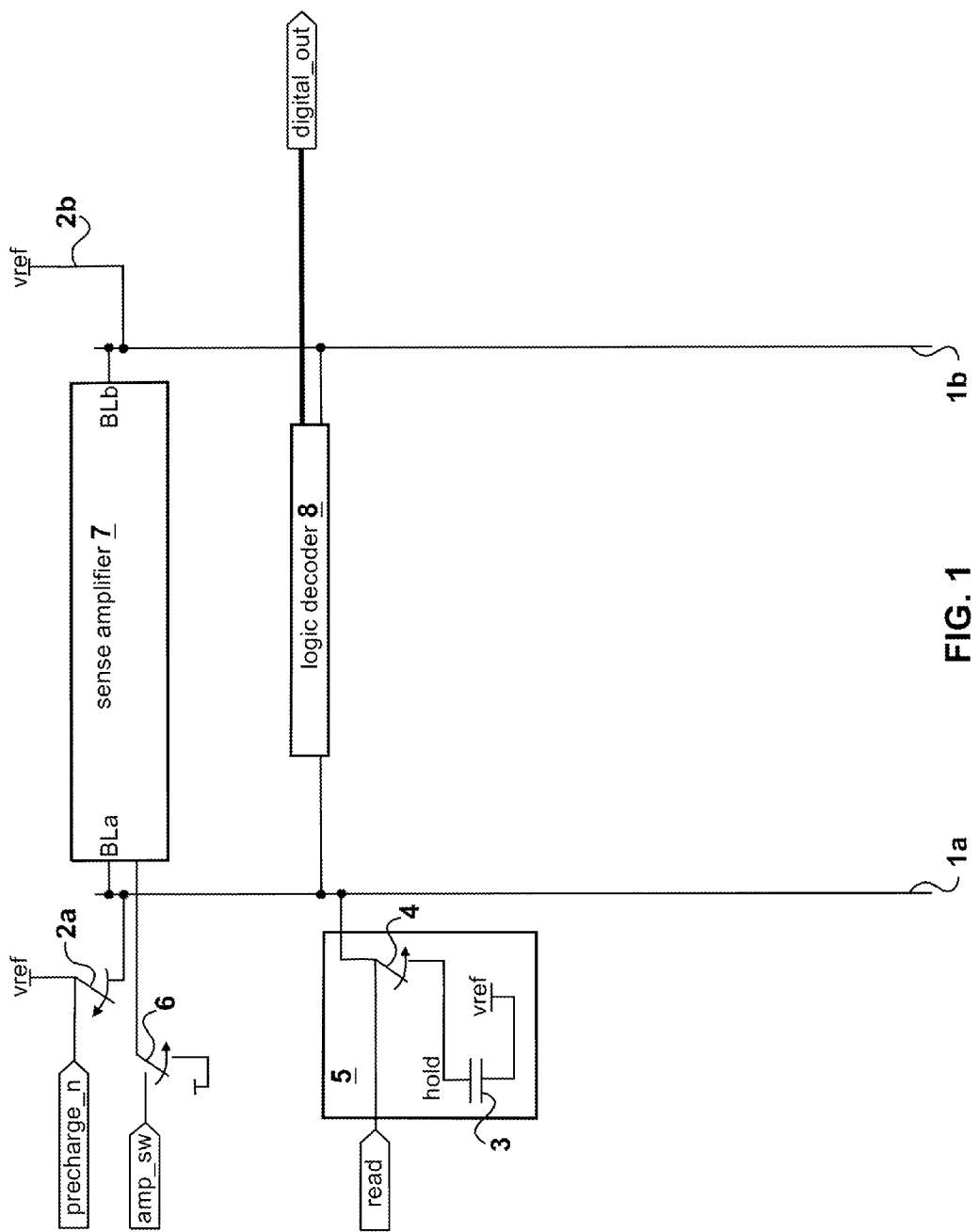
FIG. 1 is a block diagram of a basic 1T DRAM architecture from prior art.

The drawings are not to scale, in fact, some aspects have been emphasized for a better illustration and understanding of the written description.

Parts List 1a read bit line for prior art
1b reference bit line for prior art
2a precharge input switch for prior art
2b closed switch for prior art
3 storage capacitor for prior art
4 read input switch for prior art
5 1T memory bit cell
6 sense amplifier input switch for prior art
7 sense amplifier for prior art
8 1T logic decoder for prior art
9 3T logic decoder for prior art
10 memory bit cell for 3T prior art
11a read bit line
11b read bit line
12a precharge input switch
13 storage mechanism
14 read input switch
15 controlled current source
16 memory bit cell depicting broad sense of invention
17 function block
18 summation block
19 current controller
20 bit line amplifier
21 bit line amplifier latch
22 one of a pair of bit line amplifier current sources
23 one of a pair of bit line amplifier current sources
24 one of a pair of bit line amplifier switches
25 one of a pair of bit line amplifier switches
26 one of a pair of bit line amplifier inverters
27 one of a pair of bit line amplifier inverters
28 2 to 1 multiplexer
30 logic decoder
31 sequence controller
32 state machine
40 reference generator
41 DAC
50 current controller for standard differential pair embodiment
60 current controller for modified differential pair embodiment
61 opamp
70 current stop mechanism
71 D flip-flop
72 AND gate
73a current stop transistor
73b current stop transistor
90 logic decoder for parallel BASE4 embodiment
91a bit line amplifier for parallel mode BASE4 memory bit cell
91b bit line amplifier for parallel mode BASE4 memory bit cell
91c bit line amplifier for parallel mode BASE4 memory bit cell
93 storage capacitor for parallel mode BASE4 memory bit cell
98a current controller for parallel mode BASE4 embodiment
98b current controller for parallel mode BASE4 embodiment
98c current controller for parallel mode BASE4 embodiment
100a memory bit cell
100b memory bit cell
101a memory bit cell
101b memory bit cell
102a memory bit cell
102b memory bit cell
103 memory bit cell for parallel mode BASE4 embodiment
130 storage capacitor Definitions of Terms Used in this Specification For a better understanding of the present invention, it is useful to explain the meaning of certain terms that are used to explain and demonstrate the inventive concept. As used in this specification, the following terms shall have these meanings:

Unity gain, as used in this specification, means a certain configuration of an operational amplifier, opamp, in which the output of the opamp is connected to the negative input to the opamp and the output of the opamp also has a gain of one with respect to the positive input of the opamp.

Attenuation function, as used in this specification, refers to a functional relationship in the 1T architecture that reduces the difference between the bit cell voltage and a reference voltage and the reduced difference appears on the read bit line.

Gain function, as used in this specification, refers to a functional relationship in this invention that increases the difference between the bit cell voltage and a reference voltage and the increased difference appears on the read bit line.

Parasitic capacitance of a bit line, as used in this specification, refers to unintended and unwanted capacitance due to adjacent metal lines and terminals of transistors that are connected to the bit line.

Circuit topology, as used in this specification, refers to the manner in which the circuit components such as transistors, opamps and capacitors are connected together in a structure.

DETAILED DESCRIPTION OF THE INVENTION

To better understand the inventive concept and its departure from the prior art, a brief review of the prior art will be instructive.

FIG. 1 shows a block diagram for a common 1T structure of prior art. The read process of the 1T consists of the following basic steps. In the initial condition, the closed precharge input switch 2a causes the read bit line 1a to hold to the voltage value vref. At the start of a read, the precharge input switch 2a opens causing the read bit line to float at vref. Next, the read input to bit cell 5 is asserted and the switch 4 in bit cell 5 closes. The charge on the storage capacitor 3 in bit cell 5 is shared with the charge on the read bit line and the voltage of the read bit line is defined as $$\Delta V_{BL}=(v\text{hold}-v\text{ref})*(C_S/(C_S+C_{BL})) \quad \text{(Eq. 1)}$$

where $\Delta V_{BL}=V_{BL}-v\text{ref}$, $V_{BL}$ is the read bit line voltage referenced to ground, vref is a reference power supply input and vhold is the voltage on the hold node, $C_S$ is the value of the bit cell capacitor, $C_{BL}$ is the read bit line parasitic capacitance.

Throughout this read process, the reference bit line 1b remains fixed at the voltage value vref through the closed switch 2b.

At this point in the read process, there is only a small difference between the read bit line 1a and reference bit line 1b voltages due to the read bit line charge sharing. This difference is small because the change in the read bit line voltage is dependent on the bit cell capacitance to read bit line capacitance ratio, $C_S/(C_S+C_{BL})$. This ratio is always much less than one having an attenuating effect.

When the amp_sw signal is asserted the sense amplifier switch 6 closes and the sense amplifier 7 in FIG. 1 detects the small differential between the read bit line and the reference bit line and transitions both the read bit line and reference bit line to a standard digital voltage representing either 0 or 1 depending on the read bit line and the signed value of the difference. The small amplitude of the differential voltage on the bit lines is one of the main reasons the 1T architecture is susceptible to noise. The last step in the read process is the logic decoder 8 interprets the standard digital voltage differential between the bit lines and outputs a standard digital signal representing a digital value to the output signal digital_out.

The average voltage transition on the high capacitance bit line per read in a modern implementation of a 1T architecture is VDD, typically 1.5V.

Figure 2:
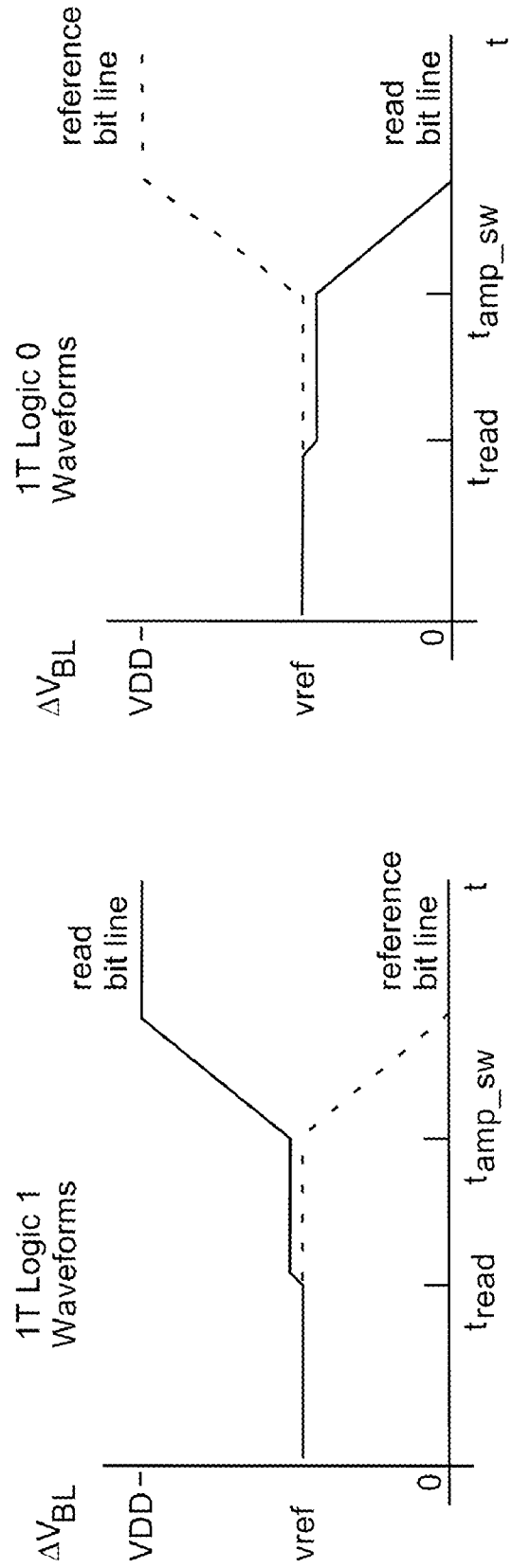
FIG. 2A and FIG. 2B are a pair of timing graphs depicting waveforms illustrating the read process using a 1T bit line pair.

FIG. 2A and FIG. 2B are a pair of timing graphs for the 1T architecture depicted in FIG. 1 and show waveforms illustrating the effect of the read process on both the read and reference bit line voltages. The graphs show that at the start of the read process at time $t_o$ the read bit line is at vref. At time $t_{read}$, the read bit line changes, making a small difference in the voltage between the read bit line and the reference bit line: a positive difference for logic 1 stored on the bit cell capacitor or a negative difference for logic 0. The reference bit line remains at the voltage value vref during this time. FIG. 2A and FIG. 2B further show that at time $t_{amp\_sw}$, the read and reference bit lines move to the value of either VDD or 0 depending on the logic value stored in the bit cell.

A particular advantage is realized when the read bit line signal is independent of the capacitance ratio of the bit cell to the read bit line. An advantage is also realized by employing a gain function instead of an attenuation function. In this way, the aforementioned noise susceptibility is reduced.

Figure 3:
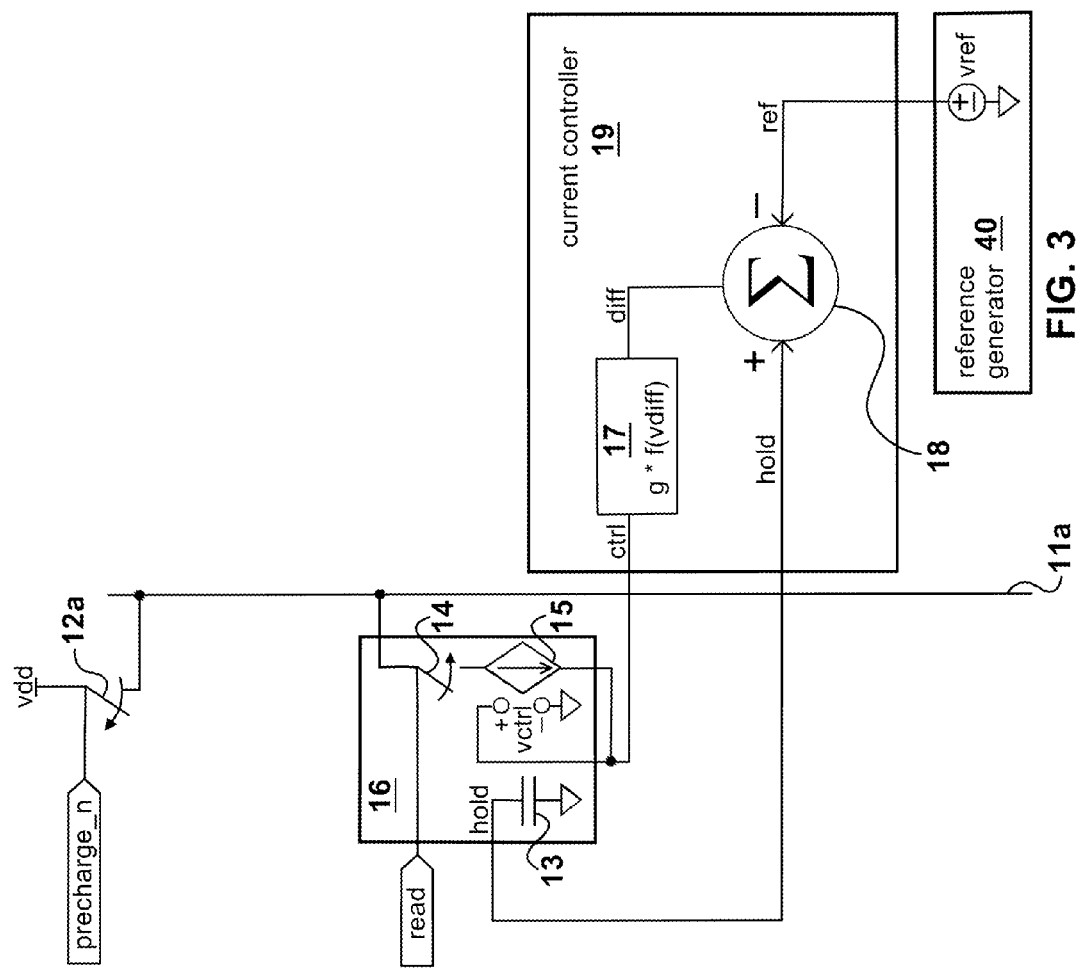
FIG. 3 is a block diagram of an embodiment in a broad sense of the invention.

FIG. 3 shows an embodiment of the memory architecture in a broad sense of the invention. It includes a reference voltage input from a reference generator 40 with a value of vref which can be varied and is not fixed. It also includes a precharge_n input and a precharge switch 12a which connects the read bit line 11a to a voltage source of value vdd when the precharge_n input signal is asserted LO. The read process includes the following basic steps with respect to the memory bit cell 16 shown in FIG. 3. In the initial condition, the closed precharge switch 12a causes the read bit line 11a to hold to the voltage value vdd. At the start of a read, the precharge switch 12a opens causing the read bit line to float at vdd. Next, the read input is asserted HI and the read switch 14 closes. The current controller block 19 makes a comparison by first subtracting the reference voltage on the ref node from the memory bit cell storage mechanism 13 voltage which is the voltage on the hold node, vhold, with the summation block 18. The output of the summation block is a voltage on the diff node, vdiff, and goes through the function block 17. The output of the function block 17 is a voltage on the ctrl node, vctrl, such that vctrl=g*f(vdiff) where g is a constant and f(vdiff) is an embodiment specific function of the voltage on the diff node, vdiff. Thus, the current controller block 19 calculates a quantity that is a function of a difference between the memory bit cell storage mechanism voltage and the reference voltage from the reference voltage input to the current controller block 19. The output of the current controller block 19 drives the voltage controlled dependent current source 15, thereby setting a current in a controlled current source from the current controller. The current in the dependent current source 15 is given by $$i=g*f(vdiff) \tag{Eq. 2}$$

where g is a gain constant and f(vdiff) represents an embodiment specific function of the voltage, vdiff, on the diff node.

This current is used to control a voltage change on the read bit line wherein the current is equal to the quantity that the current controller calculates.

The switch 14 is held closed for a time period during which the parasitic capacitance on the read bit line 11a discharges and causes the voltage on the read bit line to change from the value of vdd.

The change in the read bit line 11a voltage in FIG. 3 is given by $$\Delta V_{BL}=(g*f(vdiff)*t_{period})/C_{BL} \tag{Eq. 3}$$

where $\Delta V_{BL}$=vdd$-V_{BL\_tsample}$, $V_{BL\_tsample}$ is the read bit line voltage at time $t_{sample}$, g is a gain constant, f(vdiff) is an embodiment specific function defining the behavior of the calculated quantity in the current controller 19, vdiff is the voltage on the diff node, $t_{period}$ t is a portion of the time switch 14 is held closed and $t_{period}=t_{sample}-t_{read}$, $t_{sample}$ is the point in time the voltage on the read bit line is measured, $t_{read}$ is the point in time the switch 14 goes closed, $t_{sample}$ occurs in time after $t_{read}$ and $C_{BL}$ is the value of the read bit line parasitic capacitance.

Figure 4:
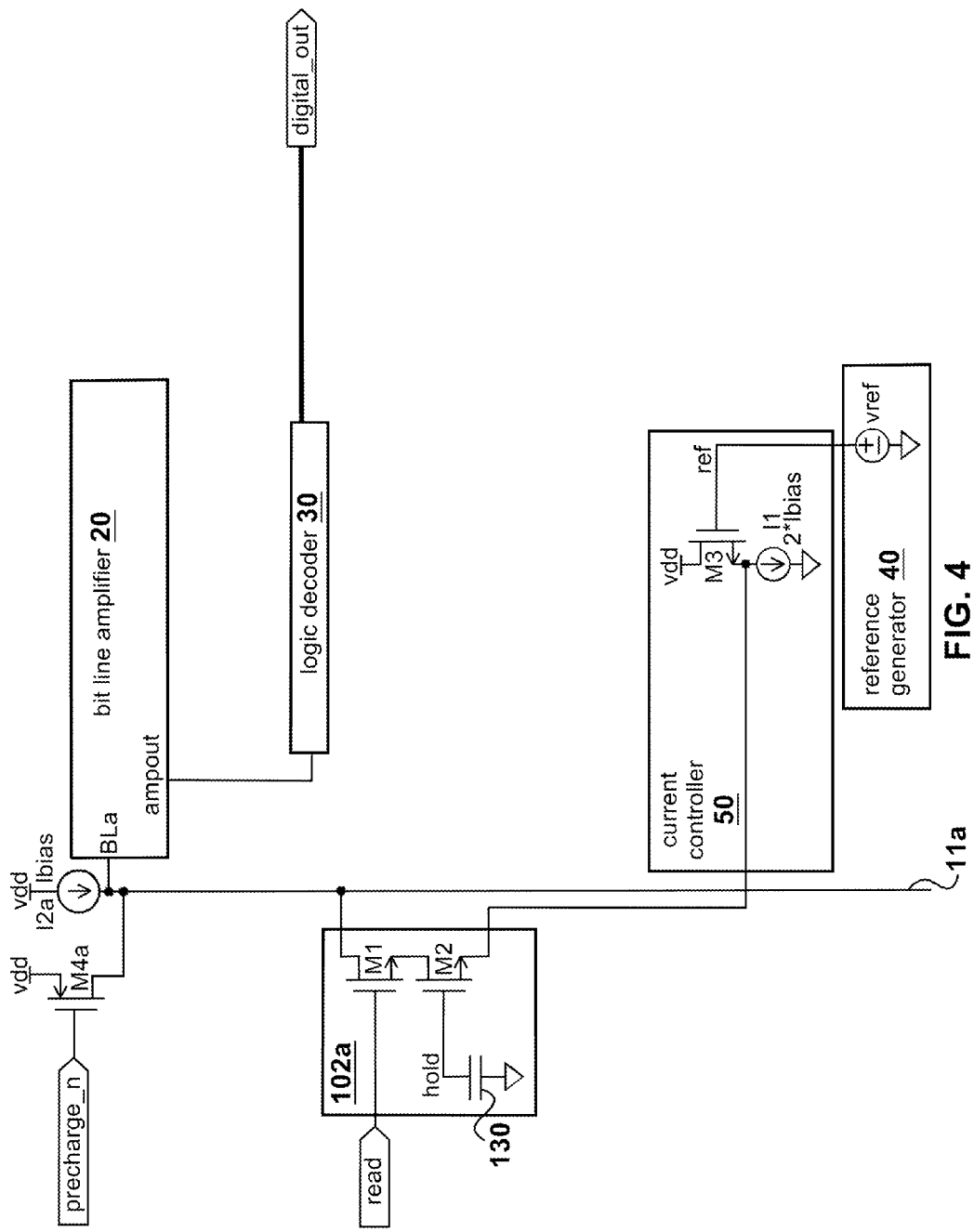
FIG. 4 is a schematic drawing illustrating an exemplary embodiment including a standard differential pair.

FIG. 4 shows an embodiment of this invention using MOS transistors where most of the idealized circuit components in the broad embodiment of FIG. 3 have been replaced with actual MOS transistors. As will be appreciated by those skilled in the art, other embodiments including, but not limited to, using JFETs, a BiCMOS process, or PMOS transistors in place of NMOS transistors, and vice versa, may be suitably used with the present invention and are contemplated in alternate embodiments. However, while the invention is susceptible to various modifications and alternative forms, it should be understood, however, that the drawing in FIG. 4, as with all other figures in this specification, and its detailed description, are not intended to limit the invention to the particular form disclosed, but on the contrary, the intention is to cover all modifications, equivalents and alternatives falling within the spirit and scope of the present invention as defined by the appended claims.

FIG. 4 shows an embodiment of the memory architecture and is based on the principle of a standard differential pair. The current controller block 19 in FIG. 3 is implemented with the reference transistor M3. This transistor M3 acts as a current controller 50. The hold node transistor M2 and the reference transistor M3 make up a standard differential pair with a tail current of 2*Ibias. The hold node and the ref node are the inputs to the differential pair and the read bit line 11a is the output. The ref node at the gate of M3 controls the current of M2, which in turn controls the voltage change on the read bit line. The bit line amplifier 20 amplifies the change in the read bit line voltage to a standard digital logic value and the logic decoder 30 samples the output of the bit line amplifier and based on the results of sampling the bit line amplifier outputs a digital value, digital_out, which represents the voltage stored on the hold node.

The FIG. 4 embodiment shows a standard differential pair that controls and changes the read bit line with a current in a hold node transistor M2 in the memory bit cell 102a. The current is determined by a function of a difference between the memory bit cell voltage, on capacitor 130, and a reference voltage, vref. This structure has a read transistor M1 with its gate connected to the read input, its source connected to the drain of the hold node transistor M2, its drain connected to the read bit line 11a, and its drain also connected to a current source 12a with a bias value in this embodiment of Ibias. The hold node transistor M2 has its gate connected to the storage capacitor 130, its source connected to the source of the reference transistor M3, and its drain connected to the source of the read transistor M1. The reference transistor M3 has its gate connected to the reference input voltage vref, its source connected to the source of the hold node transistor M2, its source also connected to a tail current source I1 with a bias value in this embodiment of 2*Ibias, and its drain connected to a voltage source, in this embodiment with a value of vdd. The precharge transistor M4a has its gate connected to the precharge_n input, its source connected to a voltage source, in this embodiment with a value of vdd, and its drain connected to the read bit line 11a.

For most values of voltage on the hold node in an embodiment as shown in FIG. 4, the transistor M2 current, $i_{d2}$, is limited by the value of the tail current bias source 11 value 2*Ibias. Therefore, for most values on the hold node, if the hold node voltage is greater than the ref node voltage and the read input signal is asserted, the transistor M2 current is equal to 2*Ibias and if the hold node voltage is less than the ref node voltage, the current is zero. In other words, for a standard differential pair embodiment of FIG. 4, the hold node transistor M2 current has an on or off nature and when it is in the on state, the M2 current value is equal to the tail current value of 2*Ibias.

For any significant positive difference between hold node voltages and the ref node voltage that persists for a period of time $t_{period}$, the change in the read bit line voltage for a differential pair embodiment of FIG. 4 is $$\Delta V_{BL}=(2*Ibias*t_{period})/C_{BL} \quad (Eq. 4)$$

where $\Delta V_{BL}$=vdd−$V_{BL\_tsample}$, $V_{BL\_tsample}$ is the read bit line voltage at time $t_{sample}$, 2*Ibias is the value of the tail current for the differential pair and also is equal to the value of the hold node transistor M2 current when it is on, $t_{period}$ is a portion of the time the read transistor M1 is held closed and $t_{period}=t_{sample}-t_{read}$, $t_{sample}$ is the point in time the voltage on the read bit line is measured, $t_{read}$ is $t_{read}$ point in time the read transistor M1 goes closed, $t_{sample}$ occurs in time after $t_{read}$ and $C_{BL}$ is the value of the read bit line parasitic capacitance.

$C_S$, the value of the bit cell capacitance is not a parameter in Equation 4 and so Equation 4 shows that the read bit line signal is independent of the capacitance ratio of the bit cell to the read bit line.

Figure 5:
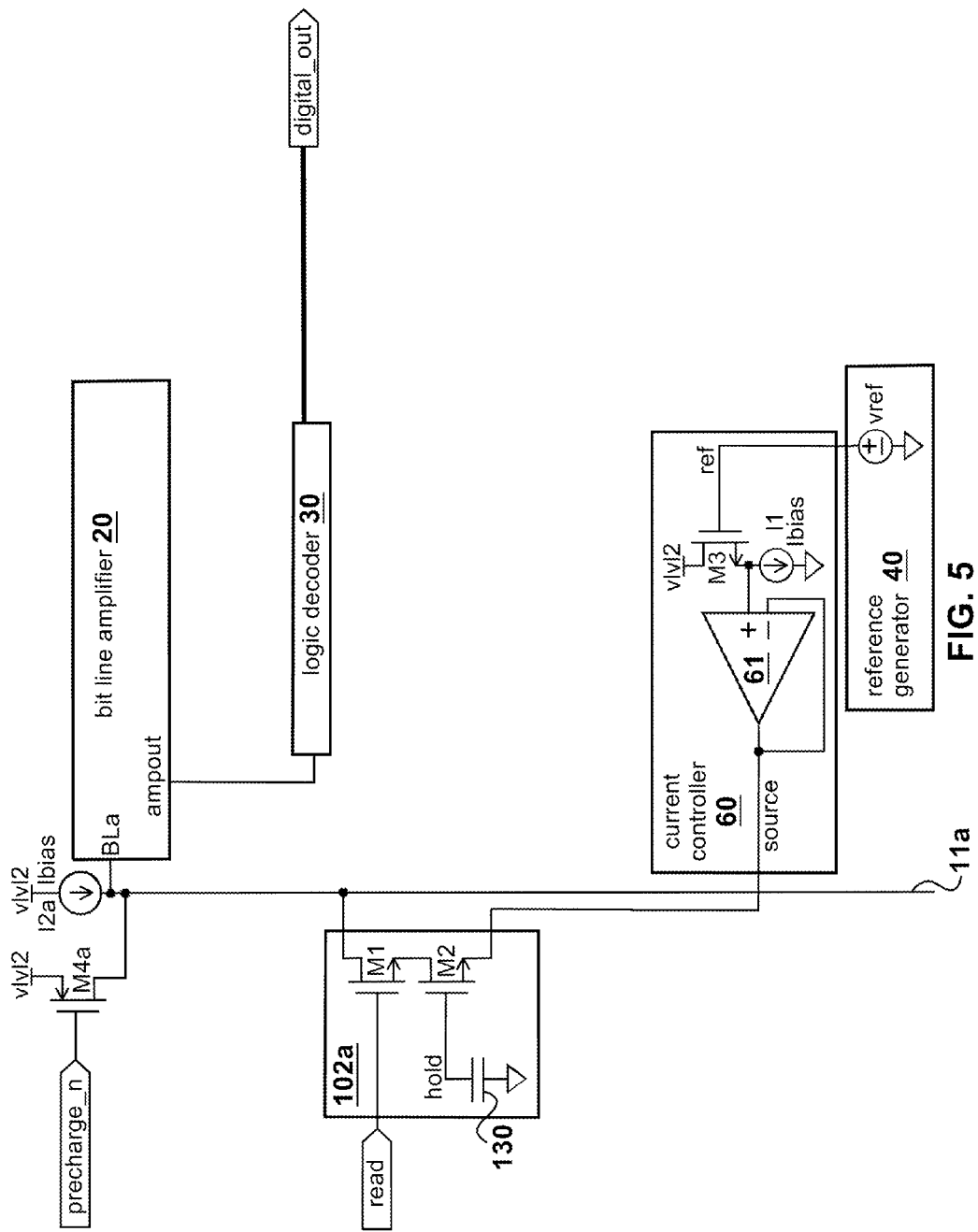
FIG. 5 is a schematic drawing depicting one embodiment including a modified differential pair.

FIG. 5 shows a schematic representation for an embodiment of the memory architecture that replaces the standard differential pair with a modified differential pair. The modified differential pair embodiment adds an opamp 61 to the standard M2 M3 differential pair configuration. The reference transistor M3 in a source follower configuration with its output buffered by the opamp 61 in a unity gain configuration makes up the current controller 60. The opamp removes the tail current limitation of the standard differential pair and allows greater current amplitude. This is desirable because for any given period of time during the read process, the greater amplitude of current causes a larger read bit line voltage change, giving a larger differential to process.

The FIG. 5 embodiment modifies the FIG. 4 embodiment as follows: adds opamp 61 in a unity gain configuration, connects the source of the hold node transistor M2 in the memory bit cell 102a to the output of the opamp instead of to the source of the reference transistor M3, connects the source of the reference transistor M3 to the positive input of the opamp instead of to the source of the hold node transistor M2, replaces the value of the voltage source connected to the drain of the reference transistor M3, vdd, with a value vlvl2, and replaces the value of the voltage source connected to the source of the precharge transistor M4a, vdd, with a value vlvl2.

For any significant positive difference between the hold node voltage in the memory bit cell 102a and the ref node voltage that persists for a period of time, the change in the read bit line voltage for a modified differential pair embodiment of FIG. 5 is $$\Delta V_{BL}=([i_{D2}-Ibias]*t_{period})/C_{BL} \quad (Eq. 5)$$

where $\Delta V_{BL}$=vlvl2−$V_{BL\_tsample}$, $V_{BL\_tsample}$ is the read bit line voltage at time $t_{sample}$, $i_{D2}$ is the hold node transistor M2 current, Ibias is the value of the current source 12a, $t_{period}$ is a portion of the time the read transistor M1 is held closed and $t_{period}=t_{sample}-t_{read}$, $t_{sample}$ is the point in time the read bit line is measured, $t_{read}$ is the point in time the read transistor M1 goes closed, $t_{sample}$ occurs in time after $t_{read}$ and $C_{BL}$ is the value of the read bit line parasitic capacitance.

The hold node transistor M2 current $i_{D2}$ is given by $$i_{D2}=(K'/2)*(vhold-vref+(2*Ibias/K')^{1/2})^2 \quad (Eq. 6)$$

where K' is the transconductance parameter, vhold is the voltage on the hold node, vref is the voltage on the ref node, it is assumed that $W_2/L_2=W_3/L_3=1$ where $W_2$ and $W_3$ are the widths and $L_2$ and $L_3$ are the lengths of transistors M2 and M3 respectively, and Ibias is the value of the current source I2a.

Substituting Equation 6 into Equation 5 gives an expression for the change in the read bit line voltage for the read process of a memory architecture having an embodiment using a modified differential pair as illustrated in FIG. 5 as $$\Delta V_{BL}=([(K'/2)*(vhold-vref+(2*Ibias/K')^{1/2})^2-Ibias]*t_{period})/C_{BL} \quad (Eq. 7)$$

Equation 7 shows the object of the invention to employ a gain function instead of an attenuation function has been achieved. The change in the read bit line voltage, which reflects the available read signal, is proportional to the square of the difference between the hold node voltage vhold and the ref node voltage vref. It also increases with time. It is also clear that once again the parameter for the storage capacitor value $C_S$ does not appear in Equation 7, therefore the read bit line is independent of the capacitance ratio of the storage capacitor of the bit cell to the read bit line.

The memory architecture having a modified differential pair embodiment in FIG. 5 has certain important advantages compared to the 1T architecture. First, the increased available read bit line signal greatly reduces noise sensitivity. Second, increased available read bit line signal also requires a less complicated bit line amplifier in a memory system employing this architecture. Reducing complexity increases yield and reduces cycle time and costs. Third, the parasitic capacitance of the read bit line is not a first order design parameter in a memory architecture that uses a modified differential pair embodiment. The actual value of the read bit line capacitance, a top level system parameter, is only of minimal importance to the design of the lower level bit cell. Therefore, changing high level system variables such as the physical height of the memory, or the number of rows or columns does not require a complete, new, and custom design of the bit cell of this architecture. Design automation techniques such as using a memory compiler can be used in the design of a memory system, further reducing design cycle time and costs.

Figure 6:
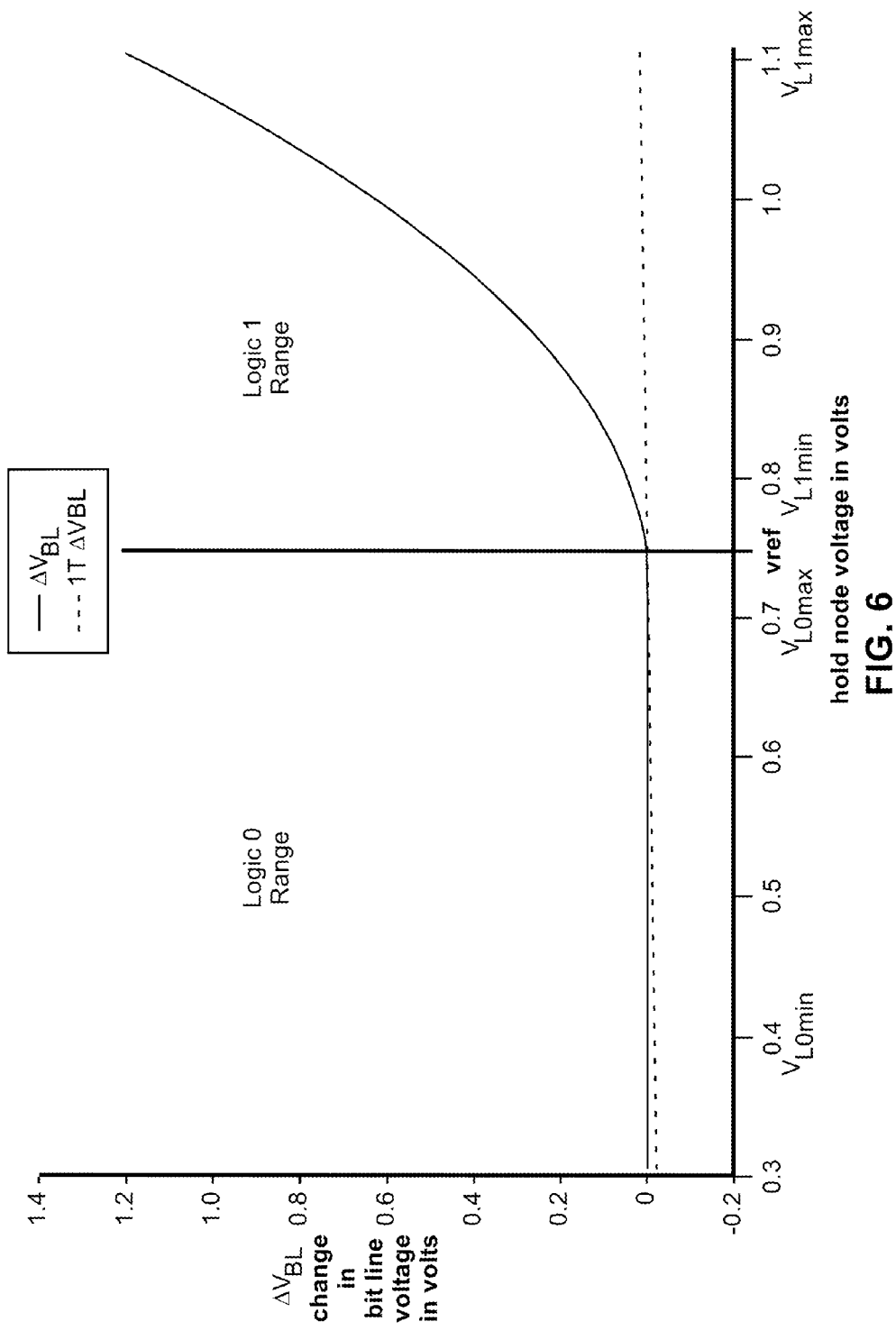
FIG. 6 is a graph plotting a comparison of available read bit line signal between an embodiment having a modified differential pair and a 1T bit cell.

FIG. 6 illustrates the magnitude of the gain function of a FIG. 5 embodiment compared to the basic 1T's attenuation function. It shows a comparison between the read bit line voltage changes due to the read process for a bit cell in a memory architecture using a modified differential pair embodiment, Equation 7 compared to the 1T bit cell, Equation 1. The change in read bit line voltage for a FIG. 5 embodiment of the invention is dramatically large compared to the 1T architecture. The following parameters are used in the FIG. 6 plots: the storage capacitor $C_S$=10fF, the parasitic capacitance $C_{BL}$=0.19 pf, $W_2/L_2$=$W_3/L_3$=1, K'=323e-6, Ibias=100 nA and $t_{period}$=10 ns. The reference voltage vref is held at 0.75V for the plot.

The x-axis is the hold node voltage. The voltage level vref defines a point above which any value of the hold node voltage represents logic 1 and below which the value of the hold node voltage represents logic 0. For logic 1 on the hold node, the hold node voltage has a value between $V_{L1min}$, 0.8V, and $V_{L1max}$, 1.1V. Likewise for logic 0, the hold node has a value between $V_{L0min}$, 0.4V and $V_{L0max}$, 0.7V. The y-axis is the change in the read bit line voltage, $\Delta V_{BL}$. For vhold=$V_{L1min}$, the lowest acceptable voltage representing a logic 1 in this comparison, the change in read bit line voltage for the 1T is 2.5 mV while for this embodiment the change is 53 mV. Likewise, for vhold=$V_{L1max}$, the highest voltage that is used to represent a logic 1 in this comparison, the change in read bit line voltage for the 1T is 17.5 mV and for this embodiment the change 1.2V. It is clear from this comparison that the change in read bit line voltage for this embodiment of the invention is at least 20 times greater than the change in read bit line voltage for the 1T architecture throughout the complete range of possible values representing a logic 1 stored on the bit cell.

Figure 7:
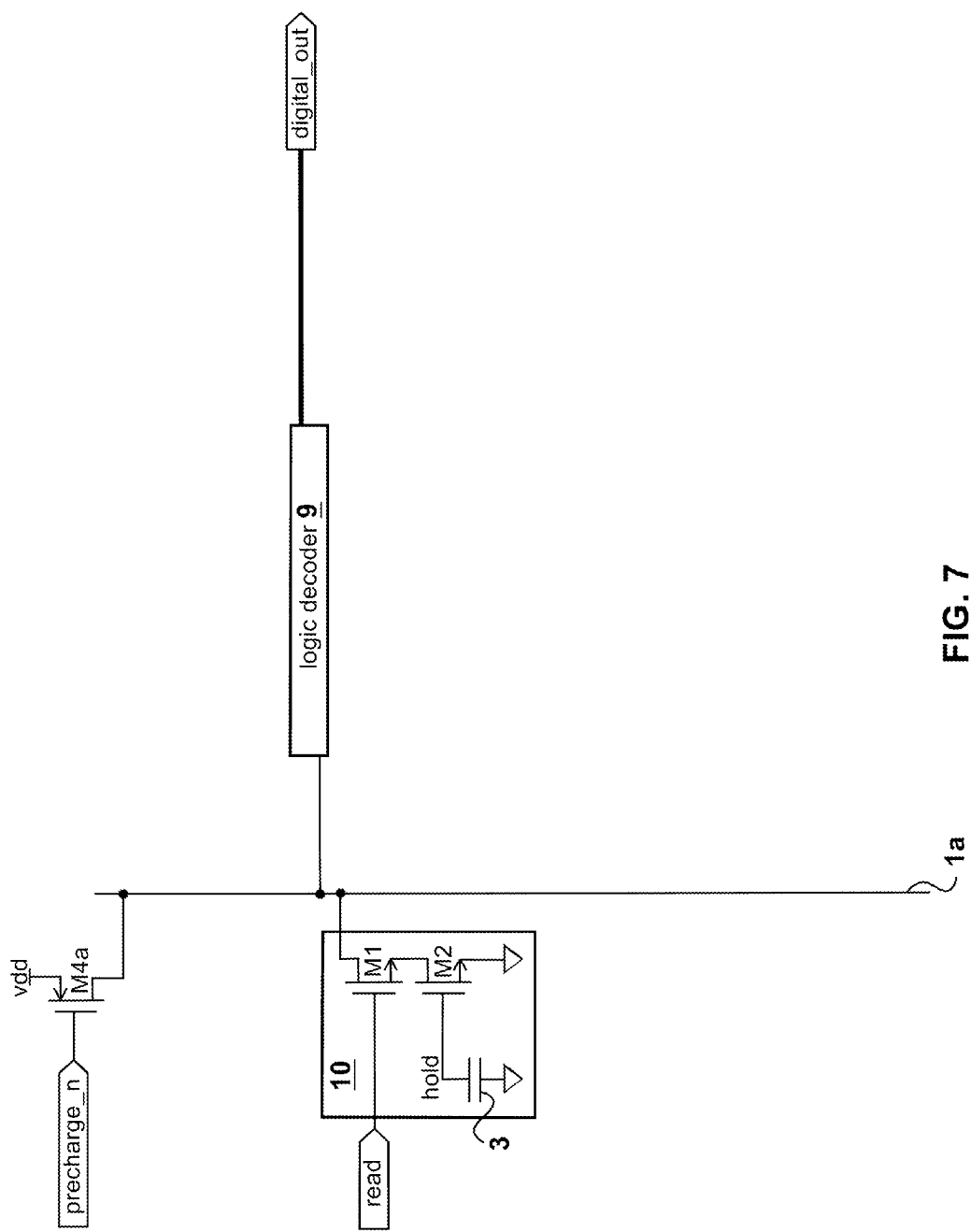
FIG. 7 is a schematic drawing illustrating a basic 3T DRAM architecture from prior art.

FIG. 7 shows a schematic drawing for a common 3T structure of the prior art. The read process of the 3T consists of the following basic steps. In the initial condition of the read process, the precharge_n input signal turns on the precharge transistor M4a. This holds the read bit line 1a to the voltage value vdd. At the start of a read, the precharge_n input signal turns off the precharge transistor causing the read bit line to float while retaining the value vdd. Next, the read input to memory bit cell 10 is asserted turning on the read transistor M1 in memory bit cell 10. This allows current to flow in the hold node transistor M2 in the memory bit cell 10 based on the value of the hold node voltage. The source of the hold node transistor is hard-wired to ground, a fixed single source. In general, if the hold node voltage is greater than the threshold voltage of the hold node transistor, also a fixed single value, then current will flow; else if the hold node voltage is less than the threshold voltage of the hold node transistor, then current will not flow. The read transistor is turned on for a time to allow the hold node transistor to discharge the parasitic capacitance on the read bit line. This discharge causes the voltage on the read bit line to move down and away from the value of vdd. A simple logic decoder 9 translates to the external system the presence of change or lack of change in the bit line voltage to a standard digital signal that represents the voltage stored on the hold node.

The average voltage transition on the high capacitance bit line per read in an implementation of a 3T architecture is VDD/2, typically 0.75V.

If $W_2$ is the width of the hold node transistor M2, $L_2$ is the length of M2 and $W_2/L_2$=1 then the change in the read bit line voltage for a basic 3T structure pictured in FIG. 7 is $$\Delta V_{BL} = [(K'/2)(vhold - V_t)^2] \ast (t_{period}/C_{BL}) \quad \text{(Eq. 8)}$$

where, K' is the transconductance parameter, vhold is the voltage on the gate of M2, $V_t$ is the threshold voltage of M2, $t_{period}$ is a portion of the time the read transistor M1 is held closed and $t_{period}$=$t_{sample}$−$t_{read}$, $t_{sample}$ is the point in time the read bit line voltage is measured, $t_{read}$, $t_{read}$ is the point in time the M1 goes closed, $t_{sample}$ occurs in time after $t_{read}$, $C_{BL}$ is the read bit line parasitic capacitance. This definition of $\Delta V_{BL}$ shows that the predictability of the 3T's control of the change on the read bit line is dependent on the threshold voltage, $V_t$, of the hold node transistor, M2. While transistor threshold voltages are effectively similar between transistors used in bit cells in a memory system on any one manufactured integrated circuit, these same thresholds vary relatively widely and unpredictably between manufactured integrated circuit parts. The 3T's control is not consistent due to the unpredictable nature of this wide threshold voltage variance inherent between manufactured parts and must be compensated for in the 3T memory system design. This variance affects the read access time along with the size of design parameters such as the voltage logic interval and the refresh interval. In a 3T memory system, these parameters must be specified so as to accommodate the wide threshold voltage variance.

An advantage is realized in cancelling the uncertain effect of the hold node transistor threshold voltage of the 3T architecture by using a differential pair construct. In differential pair embodiments of this invention, the unpredictable hold node transistor threshold voltage variance factor of the transistor is balanced and effectively eliminated by the equally similar threshold voltage variance in the reference transistor. Equation 4 for a standard differential pair embodiment and Equation 7 for a modified differential pair embodiment both define functions that are independent of a threshold voltage. Eliminating the unpredictable aspect of the threshold voltage on the current controlling the read bit line allows increased predictability and finer control of this current, resulting in increased predictability and finer control of the voltage on the read bit line. This finer control enables smaller logic voltage intervals, longer times between storage capacitor refreshes, or a combination of both advantages. Smaller logic voltage intervals allow smaller logic voltages to represent bit cell values and result in less power to write these values. Similarly, less power is needed to refresh these values. The finer control also allows the voltage on the hold node to drift closer to the refresh decision point value and results in longer refresh intervals, less frequent refreshes and power savings.

Thus, an embodiment having a standard or modified differential pair comprises at least one memory bit cell and at least one read bit line whose voltage is controlled and changed by a current in a controlled current source in the memory bit cells wherein the current in the controlled current source is set by a current controller and the controlled current source is electrically connected to the read bit line with a read switch. The current is determined by a function independent of a threshold voltage of any transistor.

Yet another advantage is realized by providing a memory architecture that performs a non-destructive read by isolating the storage mechanism from the read bit line, thereby eliminating the need for storage mechanism restore. The structure and methods of this invention allow the storage capacitor to remain isolated from the read bit line so the charge on the bit cell is not destroyed with the read process. In this manner, power requirements are reduced because there is no need to restore the voltage on the bit cell every time a read occurs. This also allows for faster reads because the restoration is not necessary.

Figure 8:
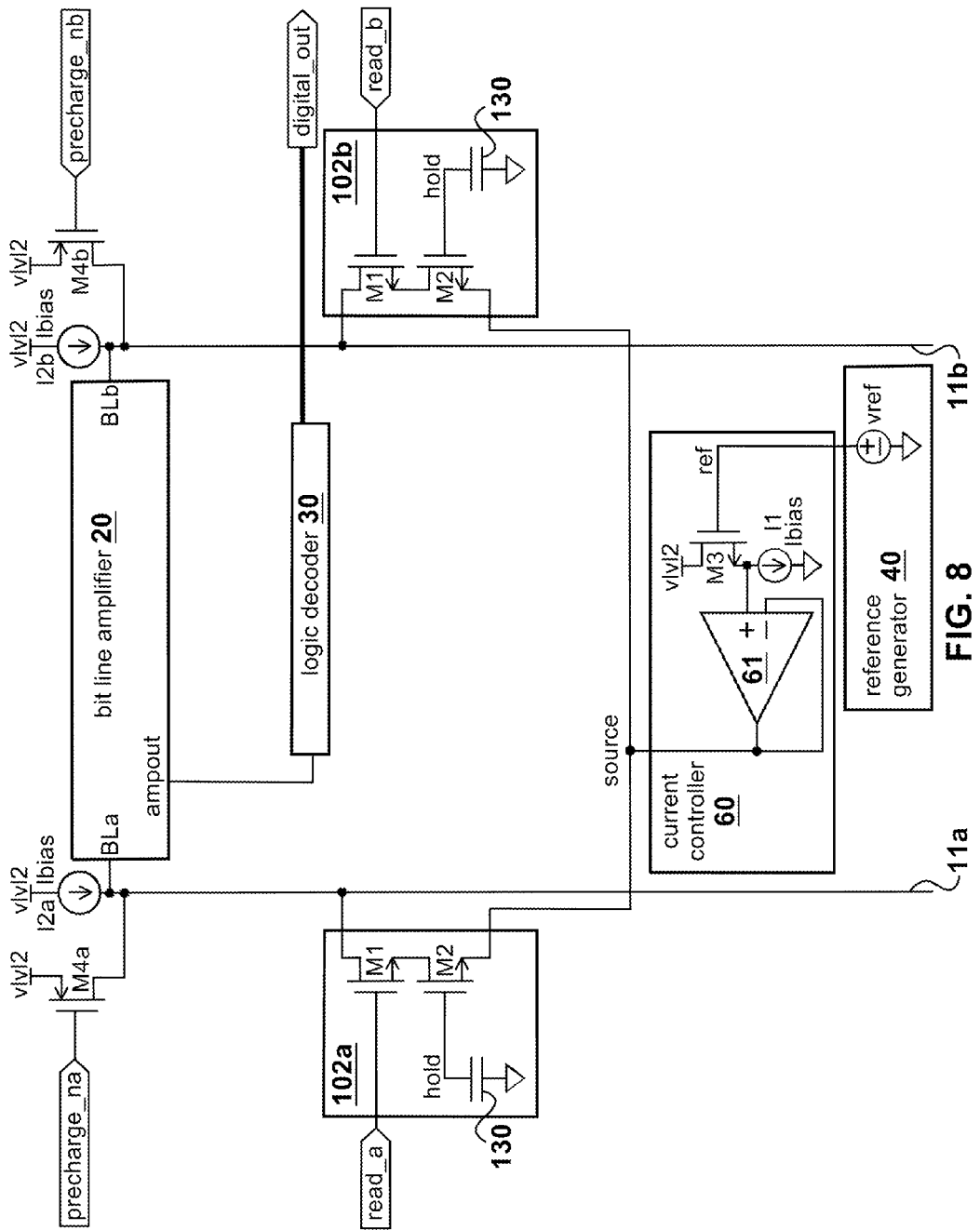
FIG. 8 is a schematic drawing depicting an embodiment including a modified differential pair with a bit line pair.

FIG. 8 is a schematic drawing depicting an embodiment as a part of a system including two bit cells, 102a and 102b, two bit lines, 11a and 11b, and a bit line amplifier 20. The bit line amplifier 20 is shared between the two bit lines, 11a and 11b. One bit line is active and one bit line is inactive and clamped to a fixed, known voltage. Although it is possible for the bit line amplifier to operate in a single-ended fashion in some embodiments, the bit line amplifier for the embodiment shown in FIG. 8 operates differentially. Also, for each read bit line one and only one bit cell is read from at a given time. A logic decoder 30 translates the output of the bit line amplifier to a standard digital signal on the output signal digital_out. This signal represents the voltage stored on the bit cell.

Yet another advantage is achieved by eliminating large standard digital voltage transitions on the read bit line, by using a bit line amplifying structure that senses the voltage change on the read bit line and transforms the voltage change to a binary value on a wire that is distinct from the read bit line and decoupled from the capacitance associated with the read bit line. In this manner power requirements are reduced compared to a 1T architecture.

In general, as discussed with respect to FIG. 1 and FIGS. 2A and 2B, after charge sharing has occurred the sense amplifier for the read process of the prior art 1T architecture senses a small voltage differential on the bit line pair. The 1T sense amplifier then amplifies the small differential voltage into a large differential voltage onto the same bit line pair. The 1T read bit line moves by a large transition to either VDD or 0 while the reference bit line moves an equally large transition in the opposite direction, again taking either the value 0 or VDD. The bit lines have a high parasitic capacitance and the full scale signal transition on these high capacitance bit lines causes undesirable power consumption.

The amplifier used with some embodiments of this invention amplifies a differential signal, but sends its output of a standard digital voltage onto a distinct wire that is decoupled from the high capacitance read bit line.

Figure 9:
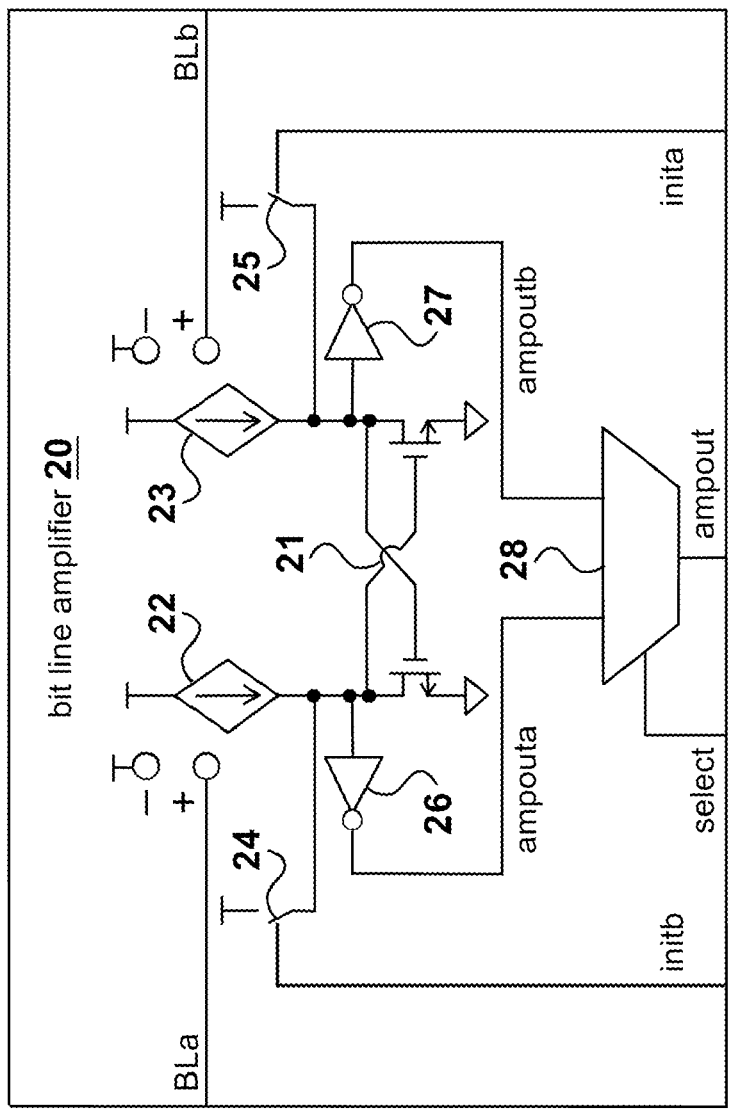
FIG. 9 is the block diagram of a differential bit line amplifier.

FIG. 9 shows a block diagram of one embodiment depicting the amplifier as a differential bit line amplifier. The amplifier consists of a latch 21 having a pair of NMOS transistors that are cross-coupled, a pair of inputs BLa and BLb from the two read bit lines, a pair of switches 24 and 25 that initialize the state of the latch, a pair of current sources 22 and 23 that change the state of the latch as a function of the difference between the voltage of the two read bit lines, and a pair of inverters 26 and 27 that invert the drain of each of the cross-coupled transistors.

The amplifier of FIG. 9 is one embodiment of the bit line amplifier 20 in the memory architecture depicted in FIG. 8. Before the start of a read the inputs inita and initb to the bit line amplifier initialize the state of the latch. During a read one of the bit line voltage inputs, BLa or BLb, stays clamped at the reference voltage by the precharge device. The other input moves away from this reference as a result of the current in the hold node transistor M2 in the active bit cell. The differential voltage between BLa and BLb causes a differential current between the current sources 22 and 23. This differential current causes the latch 21 to switch states when the differential voltage reaches a predetermined level. The two to one multiplexer 28 selects a single output signal ampout from one of the outputs of the inverters 26 and 27, ampouta or ampoutb. The inverters 26 and 27 are tied to latch 21.

The latch in the amplifier causes an output signal with standard digital voltages to be put onto a low capacitance wire that is distinct from either of the high capacitance bit lines. Power consumption is reduced to the extent that the voltage transition on the high capacitance bit line is minimized.

Figure 10:
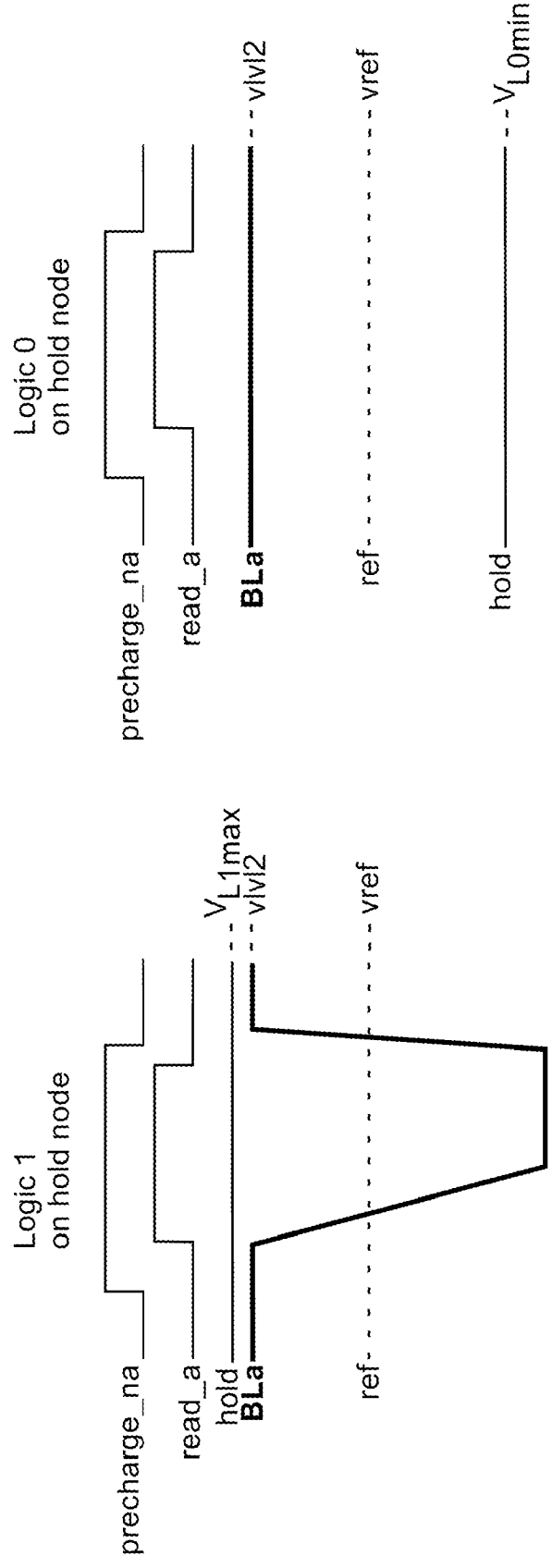
FIG. 10A and FIG. 10B are a pair of timing graphs depicting waveforms illustrating the read process for an embodiment including a modified differential pair.

FIG. 10A and FIG. 10B show two timing graphs of the waveforms for the read process of the active bit cell 102a connected to read bit line 11a in FIG. 8. These waveforms illustrate the read process for a voltage that represents a single digital bit, either a logic 1 or logic 0, stored on the hold node of the storage capacitor 130 in the bit cell 102a.

The values illustrated in the graphs are consistent with those in the discussion for the $\Delta V_{BL}$ plots in FIG. 6. For the logic 1 read, the value $V_{L1max}$ is on the hold node. After the precharge_na signal is de-asserted HI the read bit line voltage BLa floats with the voltage value vlvl2. The voltage value vref is on the ref node. The hold node, the read bit line BLa and the ref node are plotted in FIGS. 10A and 10B and are overlaid and drawn to scale. For logic 1, when the read_a signal is asserted HI, the hold node voltage is greater than the ref node voltage. Therefore, the read bit line voltage is pulled down until the M2 transistor goes ohmic. Therefore, the read bit line has a possible voltage transition from vlvl2 down to the topological limit if the current in the hold node transistor persists. For the logic 0 read, the value $V_{L0min}$ is on the hold node. When the read_a input signal is asserted HI, the hold node voltage is less than the ref node voltage value. Therefore no hold node transistor current flows and the read bit line voltage BLa does not change and remains at vlvl2.

The average voltage transition on the high capacitance read bit line per read in the BASE2 embodiment of FIG. 8 of this invention is (vlvl2−topological limit)/2, typically 0.375V if vlvl2 is 1.05V and the topological limit is 0.3V.

In general, for some embodiments of this invention the voltage on the active read bit line is pulled down when the read_a input is asserted in the read process and the condition that the hold node is greater than the ref node persists or until the components in the circuit reach their limits due to circuit topology, such as when the hold node transistor moves from the saturation region to the ohmic region. The important information content for this invention is in the initial significant moving of the read bit line voltage away from the value to which it was clamped with the precharge device. Any further transition on the read bit line after the voltage change is deemed significant, in other words, able to be sensed reliably, simply wastes power and carries no further information.

An advantage is realized when there is the ability to stop the current that controls the voltage on the read bit line at a point after the voltage change is deemed significant and before an inherent limit due to circuit topology is reached by adding a mechanism to indicate the appropriate stop time and by providing modifications to the structure to stop the current in the bit cell. In this way, the power requirements are additionally reduced.

In accordance with this invention, there are some embodiments that have some structure to detect and indicate a point past which further change in the read bit line voltage does not carry any useful information and have a switch to stop the current in the bit cell hold node transistor after receiving such an indication. In this way, the read bit line voltage is allowed to transition no more than is necessary to sense the state of the bit cell voltage value.

Figure 11:
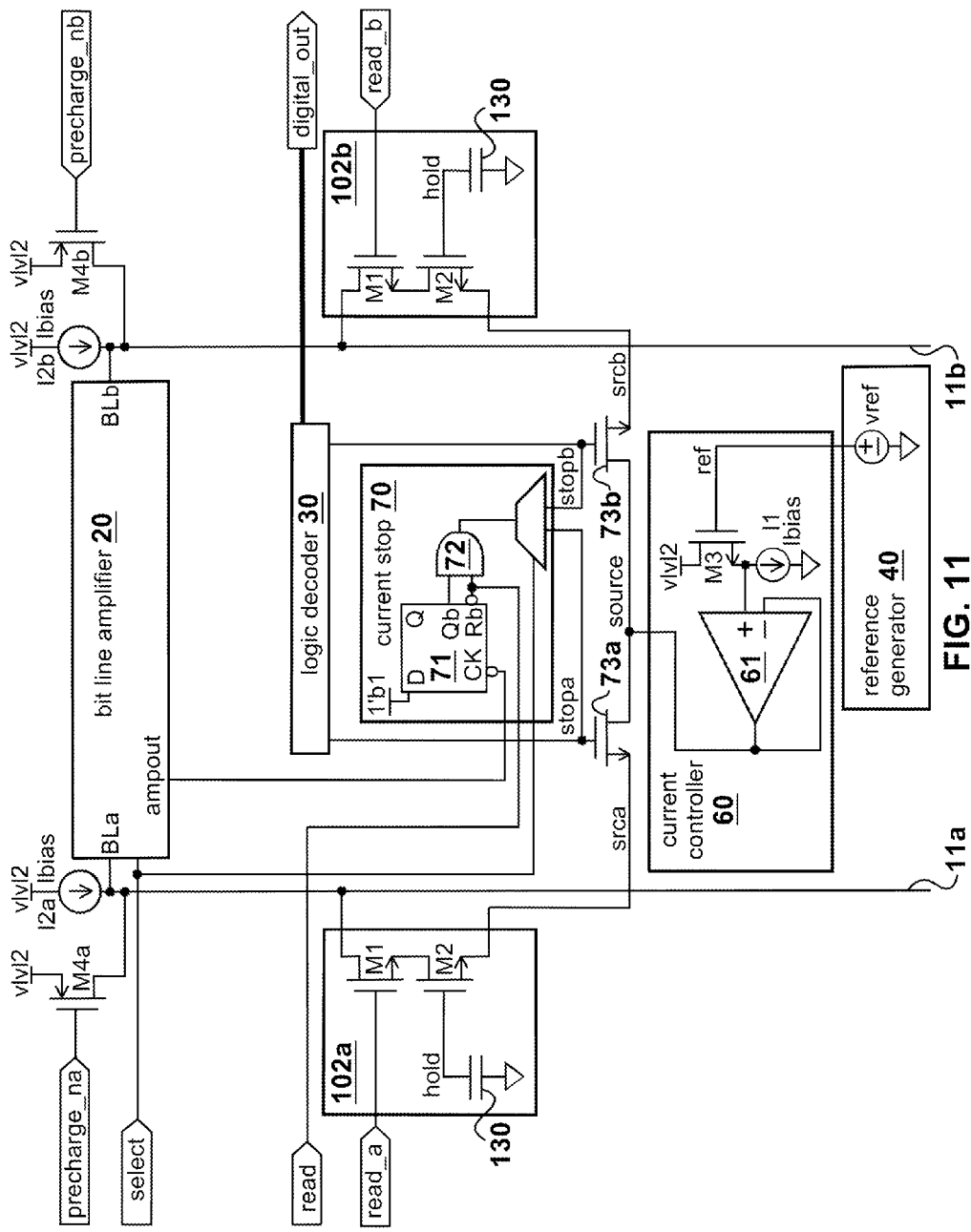
FIG. 11 is a schematic drawing of a pair of bit cells on a bit line pair using a modified differential pair embodiment with the mechanism for stopping the current.

FIG. 11 shows one embodiment that includes a structure to stop the controlling current in the bit cell. FIG. 11 has two read bit lines 11a and 11b with two memory bit cells 102a and 102b. This embodiment has a method for executing a read operation in a RAM memory architecture that further comprises the step of stopping the current in a controlled current source, the hold node transistor M2, that controls a voltage change on the read bit line when the change in the read bit line voltage is greater than a predetermined threshold such that the magnitude of a voltage transition on the read bit line is decreased thereby reducing read cycle power consumption. The output signal ampout from the bit line amplifier 20 is used as an indication signal and goes to the current stop mechanism 70 shown in FIG. 11. The current stop mechanism 70 derives the current stop signal from ampout with a D flip-flop 71 and an AND gate 72. For each column of bit cells a and b there are NMOS current stop transistors 73a and 73b between the output of the opamp 61 and the common source for each column of bit cells, srca and srcb respectively. When the gate of current stop transistor 73a or 73b is asserted LO with the signals stopa and stopb respectively, the current in the hold node transistor M2 is cut off from flowing. A signal on the ampout output from the bit line amplifier 20 indicates that the bit line amplifier has determined that the change in the read bit line voltage is greater than a certain predetermined threshold and is used to generate a stop current signal that in turn stops the current in the active bit cell.

The voltage transitions on the high capacitance read bit lines are drastically reduced because the signal on the read bit line needs to change only enough to be sensed reliably by the bit line amplifier. In this way, power is correspondingly reduced for both reads and refreshes of the memory system.

Figure 12:
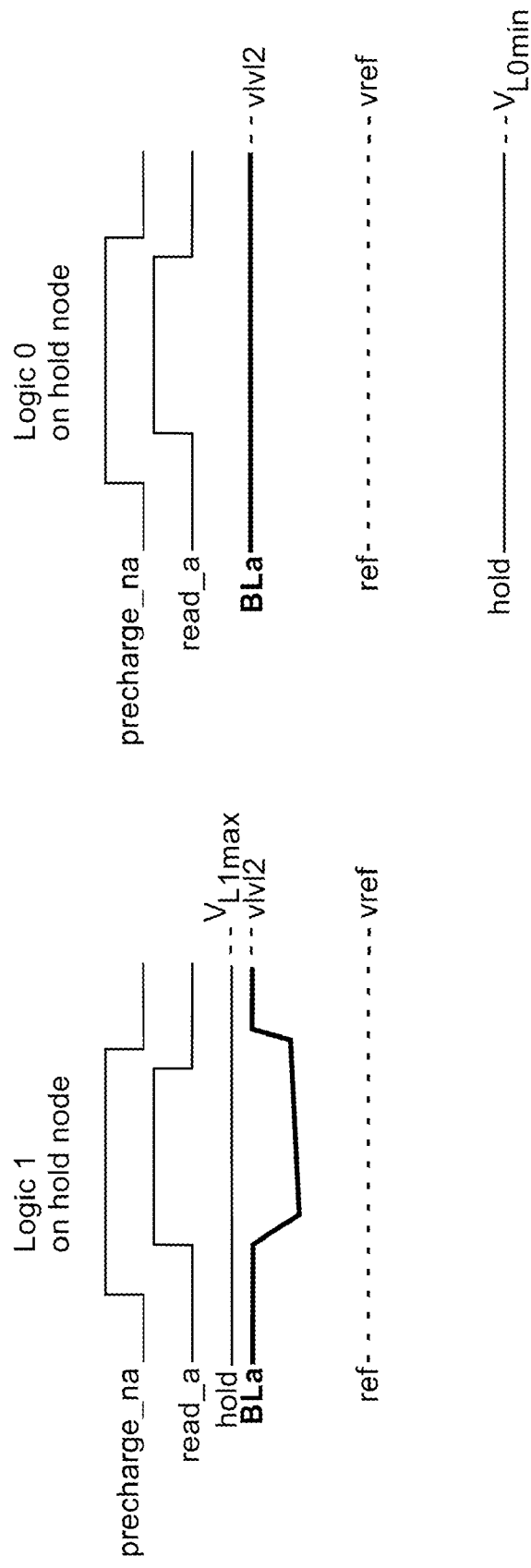
FIG. 12A and FIG. 12B are a pair of timing graphs depicting waveforms illustrating the read process for an embodiment including a modified differential pair and a current stopping mechanism with the benefits of the current stopping mechanism illustrated.

FIGS. 12A and 12B show the effect of the stop current mechanism on the change in the read bit line voltage for the read process demonstrated in FIGS. 10A and 10B. The magnitude of the logic 1 voltage transition on the read bit line is substantially smaller in a stop current embodiment. The waveforms for the logic 1 case in FIG. 12A show that when the read_a signal is asserted HI, the hold node voltage is greater than the ref node voltage. Again, because of this condition, the read bit line voltage is pulled down. However, because a bit line amplifier gives an indication signal on a wire to a current stop mechanism that a change in the read bit line voltage greater than a predetermined value has been sensed, the current in the hold node transistor stops and the voltage on the read bit line stops falling.

A comparison of the power requirements for the read process using typical values for relevant parameters for a 1T architecture of prior art, a 3T architecture of prior art, a BASE2 embodiment of this invention, and a BASE2 embodiment of this invention using the current stop mechanism follows.

The average voltage transition on the high capacitance bit line per read in a modern implementation of a 1T architecture is VDD, typically 1.5V.

The average voltage transition on the high capacitance bit line per read in an implementation of a 3T architecture is VDD/2, typically 0.75V.

The average voltage transition on the high capacitance read bit line per read in the BASE2 embodiment of FIG. 8 of this invention is (vlvl2−topological limit)/2, typically 0.375V if vlvl2 is 1.05V and the topological limit is 0.3V.

The average voltage transition on the high capacitance read bit line per read in the BASE2 embodiment of FIG. 11 of this invention is typically 0.1V when the current stop mechanism is implemented.

Therefore for a typical set of design parameters the read process for the BASE2 embodiment of this invention including the effects of the current stop mechanism reduces the power requirements by a factor of approximately 20× compared to a 1T architecture. It improves the power requirements by approximately 10× compared to a 3T architecture.

In this way, by meeting the object of the invention to indicate the appropriate time and stopping the current at this time, the voltage transition on the read bit line with high capacitance is made much smaller. As a result, power requirements are greatly reduced and significant power savings are realized over 1T and 3T architectures. The stop current feature also provides an additional benefit, improvement in the speed of the read process.

The power requirements are reduced still further by using this invention in a multi-bit per cell mode.

An advantage is realized by using multiple reference signals to control the change on the read bit line by using a standard or modified differential pair construct with a plurality of input reference levels. In this way, the function that controls the read bit line has a plurality of source levels instead of a single hard-wired source level. This plurality facilitates a multi-bit cell.

Figure 13:
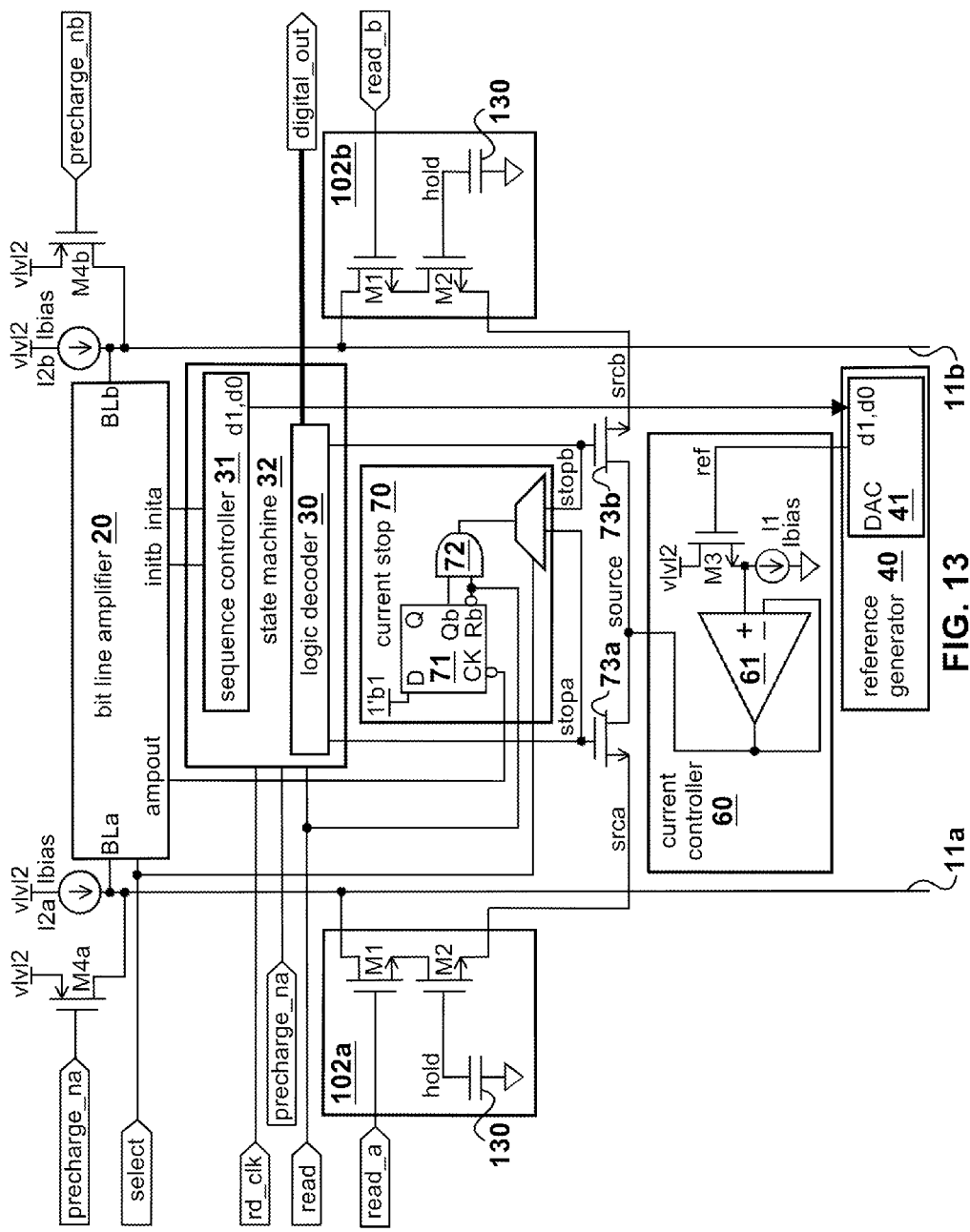
FIG. 13 is a schematic drawing of a pair of bit cells on a bit line pair with a modified differential pair embodiment with a plurality of reference input voltages and a state machine.

FIG. 13 represents an embodiment variation of FIG. 11 with multiple reference sources. The multiple references are controlled from the sequence controller 31 in state machine 32 with the {d1, d0} output from the sequence controller controlling the supply of a reference voltage from the DAC 41 to the ref node. This embodiment of the invention is a memory architecture wherein the reference voltage has one of a plurality of predetermined reference values. The voltages stored on the bit cells in this embodiment represent BASE4 values. The power requirements are reduced by operating the modified differential pair memory architecture in a BASE4 or higher mode, wherein a BASE4 embodiment has four levels on the storage capacitor to represent two digital bits. The functionality and the number of components per bit cell are the same as for a BASE2 implementation while the bit cells each store twice as much data. An embodiment such as this implies a sequential application of a reference voltage such that one and only one of a plurality of predetermined reference values is applied at a time, whereby an algorithm is used to monitor a read bit line change in voltage of a read bit line as the reference voltage is sequenced and compared to the stored voltage on the storage capacitor of the memory bit cell.

FIGS. 14A, 14B, 14C, and 14D show a set of timing graphs depicting waveforms illustrating the read process for a BASE4 embodiment of FIG. 13 using sequentially supplied voltage input references. The BASE4 voltage values are vlvl0, vlvl1, vlvl2 and vlvl3. The waveforms for each value are illustrated individually. The rd_clk has an 80% duty cycle in this embodiment and is shown in FIGS. 14A, 14B, 14C, and 14D. The read process includes the following basic steps. In the initial condition, the precharge_na input is asserted LO and forces the voltage on the read bit line 11a to the value vlvl2 through the transistor M4a. The precharge_na input is de-asserted and the read_a input is asserted HI. Then the ref voltage to the reference transistor M3 connected to the opamp 61, and to the source of the hold node transistor M2 in the active bit cell 102a that is connected to read bit line 11a is sequentially stepped between the three reference voltage levels, vlvl3−Δ, vlvl2−Δ, and vlvl1−Δ, where Δ is any voltage large enough to be sensed by a differential pair and vlvl3>vlvl3−Δ>vlvl2>vlvl2−Δ>vlvl1>vlvl1−Δ>vlvl0.

In this way, as the voltage on the ref node is stepped, at each respective level a comparison is made between the ref node voltage and the voltage value stored on the hold node causing the read bit line 11a to respond accordingly. When the ref voltage is stepped to a value lower than the voltage on the hold node the read bit line voltage will decrease. Therefore, the point in the sequence of comparisons that the read bit line voltage first drops as a result of a comparison indicates the value stored on the hold node.

Figure 14A:
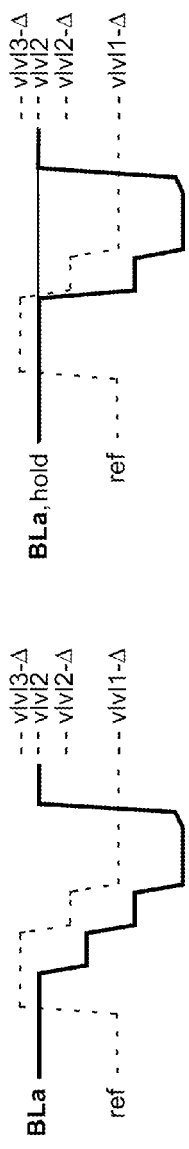
FIGS. 14A, 14B, 14C and 14D depict a set of timing graphs depicting waveforms illustrating the read process for an embodiment including a modified differential pair working in a multi-bit per bit cell mode.

The first case in FIG. 14A illustrates the voltage value vlvl3 on the hold node. When the read_a input is asserted HI, the ref node starts out vlvl3−Δ, initially lower than the voltage on the hold node in the bit cell. The read bit line voltage is pulled down until the hold node transistor goes ohmic and the drain is nearly equal to the source. The read bit line BLa waveform for the vlvl3 case shows that the voltage on the read bit line drops at the first comparison of the hold node and the ref node indicating that the value on the hold node is vlvl3.

Figure 14B:
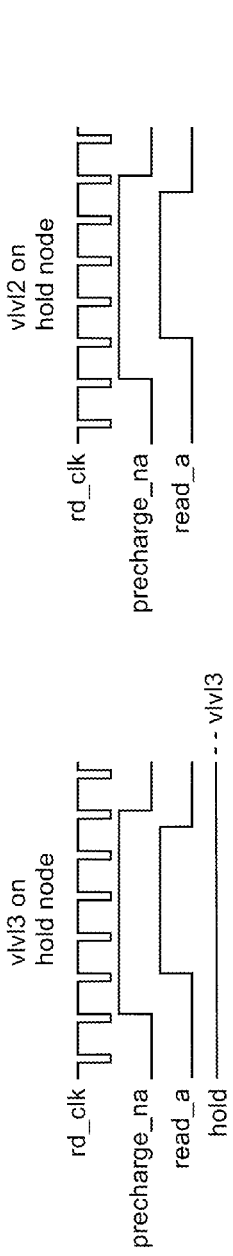

The second waveform graph in FIG. 14B illustrates the voltage value vlvl2 on the hold node. When the read_a is asserted HI, the ref node at vlvl3−Δ, is higher than the value on the hold node. The read bit line voltage remains unchanged. Subsequently, when the ref input level is stepped down to vlvl2−Δ and is lower than the voltage on the hold node, the read bit line is pulled down to the point where the hold node transistor goes into the ohmic region and its drain is nearly equal to the source. The read bit line waveform for the vlvl2 case shows that the voltage on the read bit line drops at the second comparison of the hold node and the ref node indicating that the value on the hold node is vlvl2.

Figure 14C:

The third waveform graph in FIG. 14C illustrates the voltage value vlvl1 on the hold node. The read bit line remains unchanged while the ref node voltage level steps through the values vlvl3−Δ and vlvl2−Δ. At vlvl1−Δ, when the ref voltage is less than the hold node voltage, the read bit line voltage goes down. Thus the read bit line waveform for the vlvl1 case shows that the voltage on the read bit line drops at the third comparison of the hold node and the ref node indicating that the value on the hold node is vlvl1.

Figure 14D:
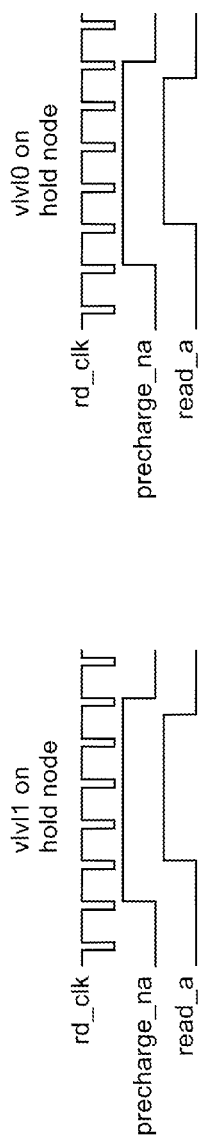

The fourth waveform graph in FIG. 14D illustrates the voltage value vlvl0 on the hold node. The ref node voltage level remains higher than the hold node voltage throughout all three comparisons and the read bit line voltage remains unchanged. The lack of read bit line voltage change through all three comparisons indicates in this BASE4 embodiment that the value of the hold node is vlvl0.

In this way, from FIGS. 14A, 14B, 14C, and 14D and their description of the sequential BASE4 read process for the memory architecture having a BASE4 embodiment, it is clear that four levels are easily read from the bit cell.

FIGS. 15A, 15B, 15C, and 15D illustrate the additional advantages of the current stop mechanism in a BASE 4 embodiment. These advantages are similar to the advantages realized in a BASE 2 embodiment. That is, the information lies is in the initial moving of the read bit line voltage away from the value to which it was clamped with the precharge device and additional voltage transitions on the read bit line are eliminated resulting in further power and time savings.

Figure 16:
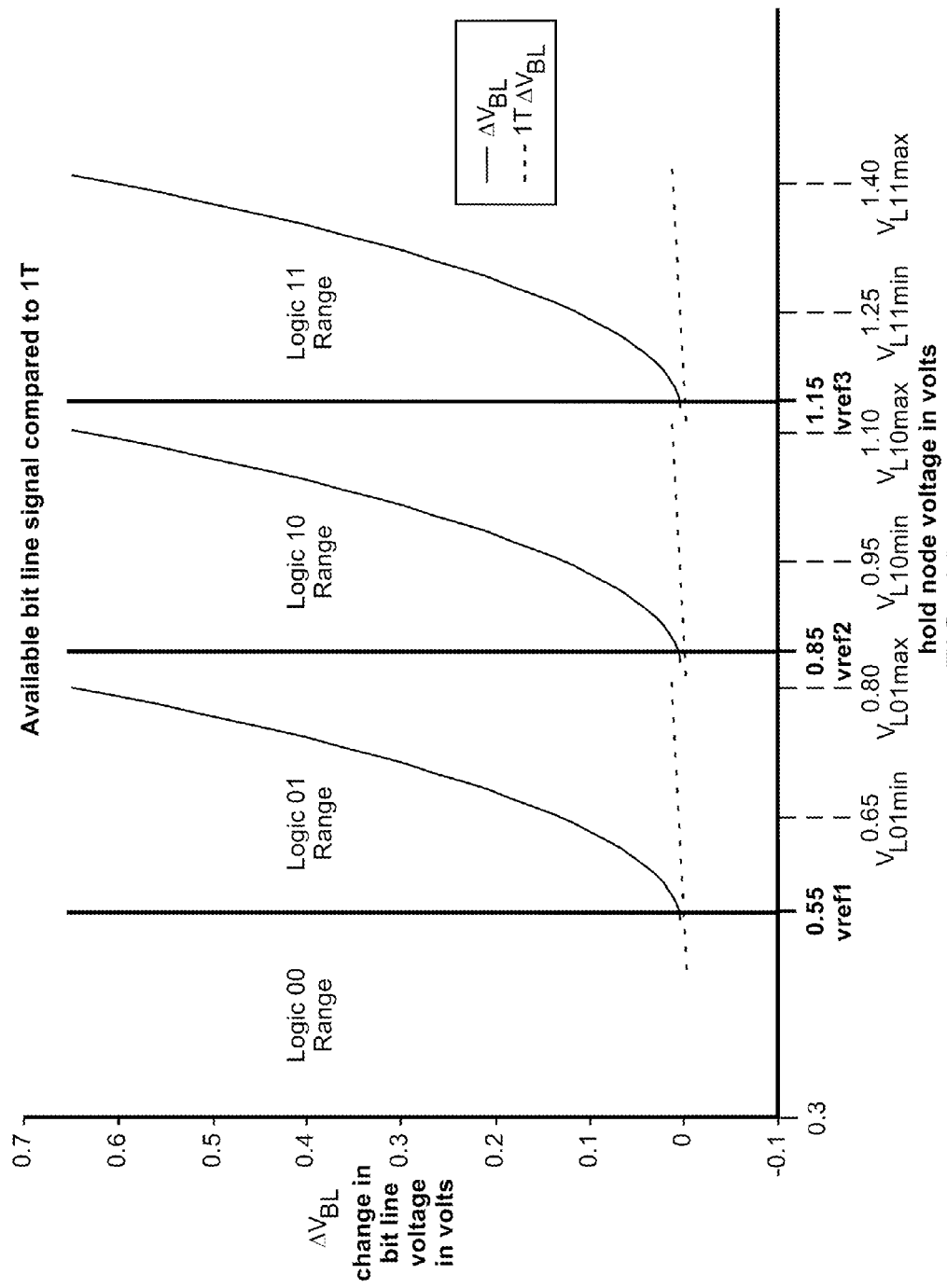
FIG. 16 is a graph plotting a comparison of available read bit line signal between a modified differential pair embodiment and a 1T bit cell for a bit cell operating in a multi-bit per cell mode.

FIG. 16 illustrates a plot of $\Delta V_{BL}$ from the 1T Equation 1 and the embodiment of this invention given in Equation 7. It shows a comparison between the read bit line voltage changes due to the read process for four voltage levels stored on the hold node representing two digital bits. The following parameters are used in the plot. The storage capacitor $C_S$=10fF, the parasitic capacitance $C_{BL}$=0.19 pf, $W_2/L_2$=$W_3/L_3$=1, K'=323e−6, Ibias=100 nA, $t_{period}$=10 ns. The reference voltage vref has the values 0.55V, 0.85V, and 1.15V respectively. The x-axis is the hold node voltage. The graph is divided into four sections for hold node values representing logic values 2'b00, 2'b01, 2'b10, and 2'b11 respectively. The sections are delineated by the values for the three reference voltages vref1, vref2, and vref3. The y-axis is the change in the read bit line voltage, $\Delta V_{BL}$ resulting from reading the voltage on the hold node given on the x-axis. For example, the curves in the logic 2'b01 section plots Equation 1 and Equation 7 with the value of vref, equal to 0.55V. For vhold=$V_{L01min}$=0.65V the change in read bit line voltage, $\Delta V_{BL}$ is 5 mV for the 1T and 138 mV for an embodiment of this invention. Similarly, at the other end of the 2'b01 range, for vhold=$V_{L01max}$=0.8V the 1T has an available signal of 12.5 mV while an embodiment of this invention has 649 mV. The curves in the sections for logic values 2'b10 and 2'b11 are shown with reference voltages equal to 0.85V and 1.15V respectively and depict similar differences between the 1T and an embodiment of this invention.

FIG. 16 illustrates the large amount of available signal on the read bit line, making it relatively easy for embodiments of this invention to process a plurality of digital bits on the same bit cell without adverse noise sensitivity.

FIG. 13 further shows the memory architecture with a state machine 32. FIG. 13 shows that state machine 32 has a sequence controller 31 and a logic decoder 30.

By including a state machine having a sequence controller and a logic decoder other advantages are provided when the sequence controller controls a voltage step sequence in a reference voltage from a reference voltage input to the current controller and the logic decoder decodes the voltage stored on the bit cell by evaluating the output of an amplifier structure as it responds to the changes in the reference voltage.

Figure 17:
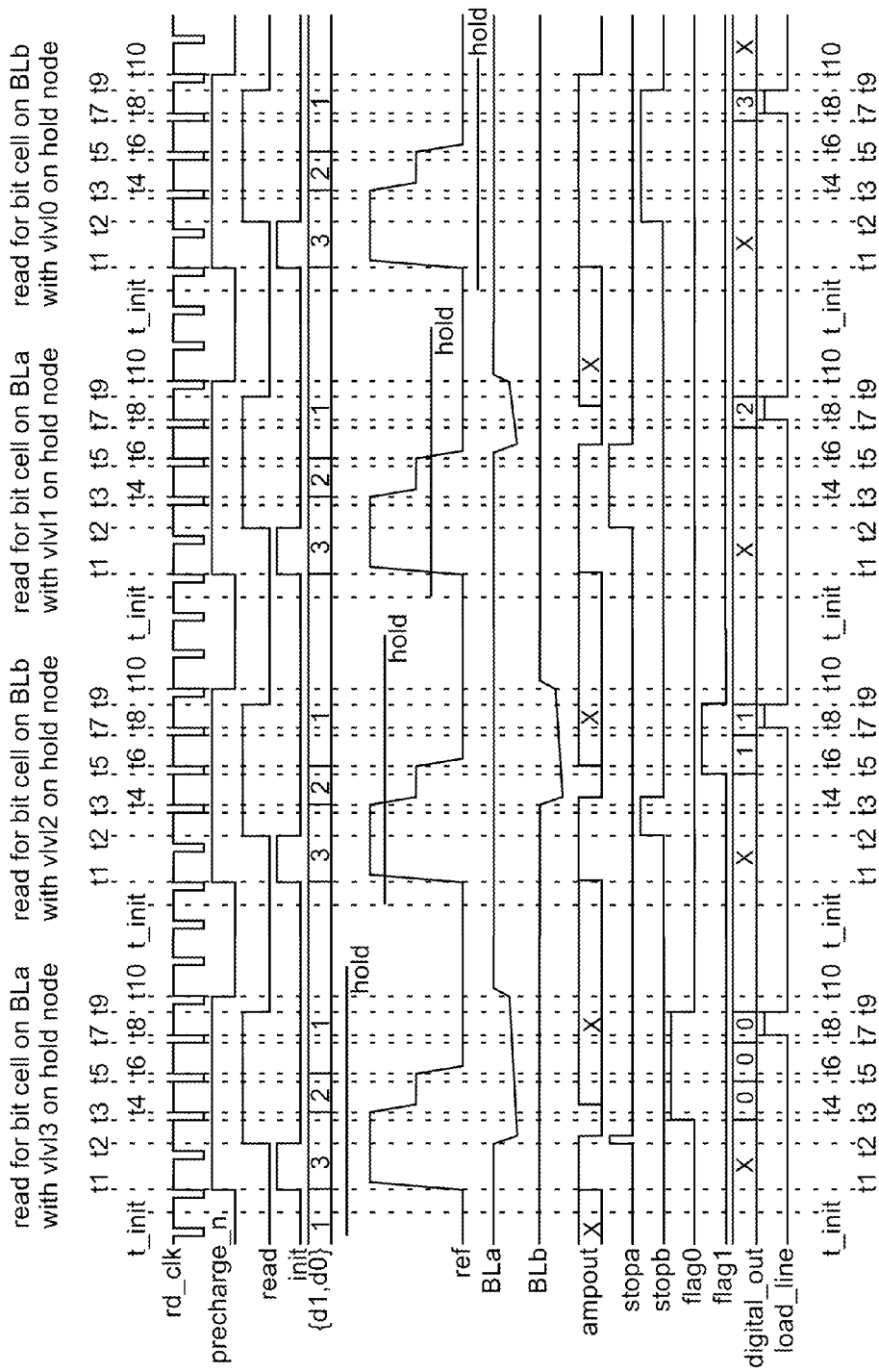
FIG. 17 depicts a timing graph with waveforms illustrating the read process for the memory architecture in an embodiment of this invention with four levels stored on the bit cell representing two digital bits including the functionality of the sequence controller and logic decoder.

FIG. 17 shows waveforms that further illustrate the read process for the memory architecture in this invention depicted in FIG. 13 when in a BASE4 mode where four levels are stored in the bit cells representing two digital bits where the waveforms include the behavior of the current stop mechanism and the decoding algorithm. The state machine 32 is controlling the process with the sequence controller 31 and the logic decoder 30.

Four different cases for the read process are depicted in FIG. 17, each with a different value on the hold node. The {d1,d0} bus from the sequence controller controls the ref node voltage through the DAC. The read bit lines BLa and BLb are shown responding to the output of the DAC with the corresponding comparisons in the bit cell between the hold node and the ref node along with the effect of the current stop mechanism according the principles discussed for FIGS. 15A, 15B, 15C, and 15D. The output of the bit line amplifier ampout is shown responding to the read bit line voltage change as per the discussion of FIG. 9. The current stop signals stopa and stopb are derived from the output of the bit line amplifier ampout and are latched with the D flip-flop 71. The logic decoder 30 samples the stopa and stopb signals from the current stop mechanism 70 to determine if they are LO. Since these signals, stopa and stopb, are derived from the output of the bit line amplifier, ampout, the logic decoder 30 is effectively sampling the output of the bit line amplifier. Internal to the logic decoder 30 are the signals flag0 and flag1 which are used in the decoding of the voltage stored on the hold node. The output digital_out represents the two bit digital value corresponding to the four level value stored on the hold node. The external system is notified with the logic output signal load_line that the digital_out value is ready to be latched, although the load_line signal is not shown in FIG. 13.

Advantages are realized with a memory architecture that can read a value from a storage mechanism, including a value representing multiple bits, by using a structure or method that includes one or more or the aforementioned objects.

Significant power and speed advantages can be realized if the invention is used in many configurations and embodiments. This invention is not limited to sequential processing nor is it limited to a BASE2 or a BASE4 configuration.

Figure 18:
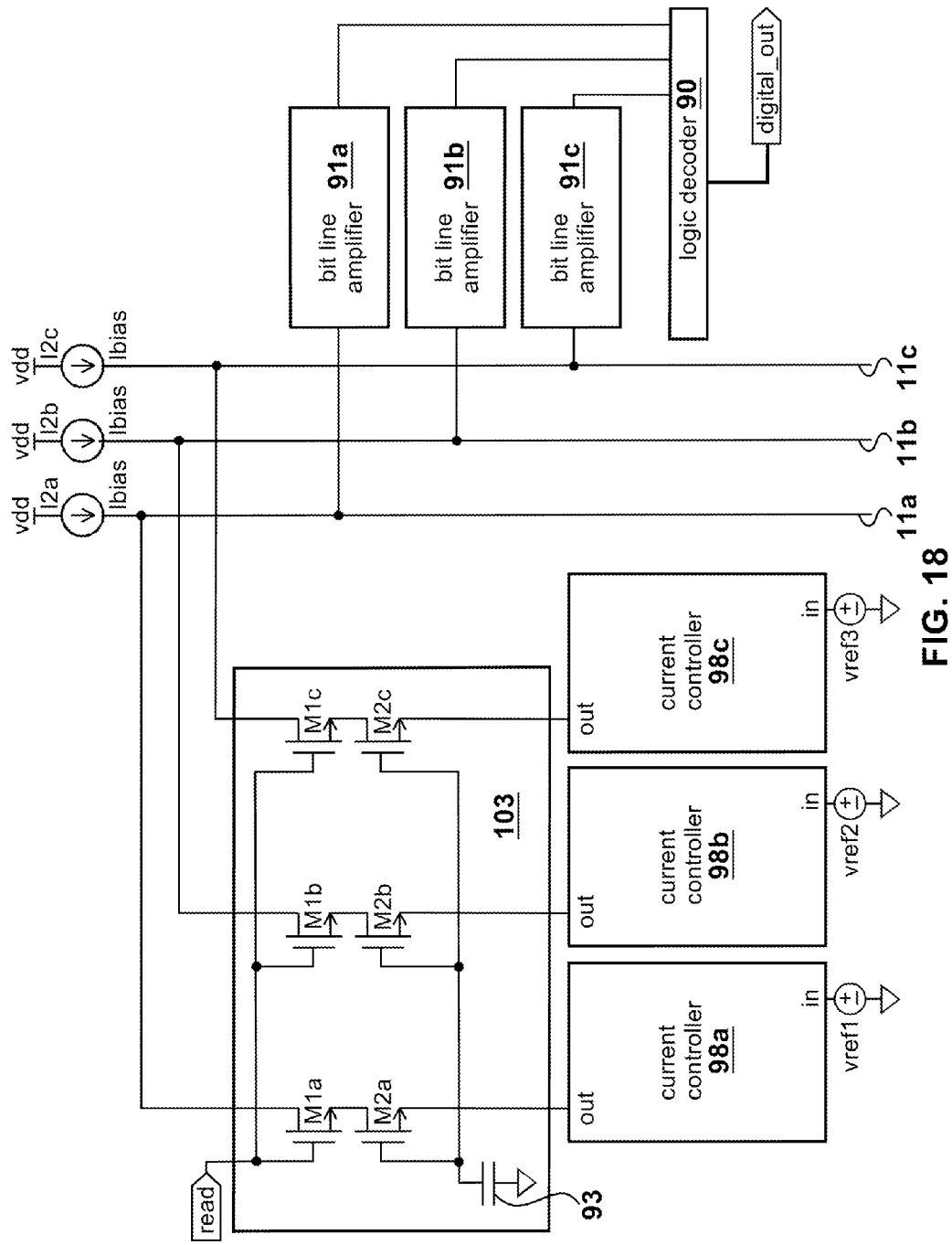
FIG. 18 is a schematic drawing depicting a parallel mode memory bit cell wherein the reference voltages are connected in parallel; the bit cell has three current controllers and is electrically connected to three read bit lines.

FIG. 18 depicts a BASE4 embodiment operating in parallel. Such an embodiment has a plurality of predetermined reference voltages which are available in parallel. Bit cell 103 has a single storage capacitor 93 with one of a plurality of voltages stored on it to represent a plurality of digital bits and is shared with a corresponding plurality of hold node transistors M2a, M2b, and M2c. Each hold node transistor is connected to its own read bit line 11a, 11b, and 11c through read switches M1a, M1b, and M1c. Multiple references are applied to current controllers 98a, 98b, and 98c according to the aforementioned teachings, but are applied in a parallel manner. A logic decoder 90 determines the voltage stored on the shared capacitor by monitoring the plurality of read bit line amplifier 91a, 91b, and 91c outputs. Multi-bit parallel embodiments such as are depicted in FIG. 18 realize faster read times Another possible embodiment is to use a BASE4 or higher sequential design as depicted in FIG. 13 and FIG. 17, but operating a BASE4 embodiment alternately in a BASE2 manner by not stepping the reference; perhaps switching modes from BASE4 to BASE2 under command of the external system. In this way, the same memory architecture could be used in either BASE2 mode or BASE4 mode and could be changed according to the application.

Figure 19:
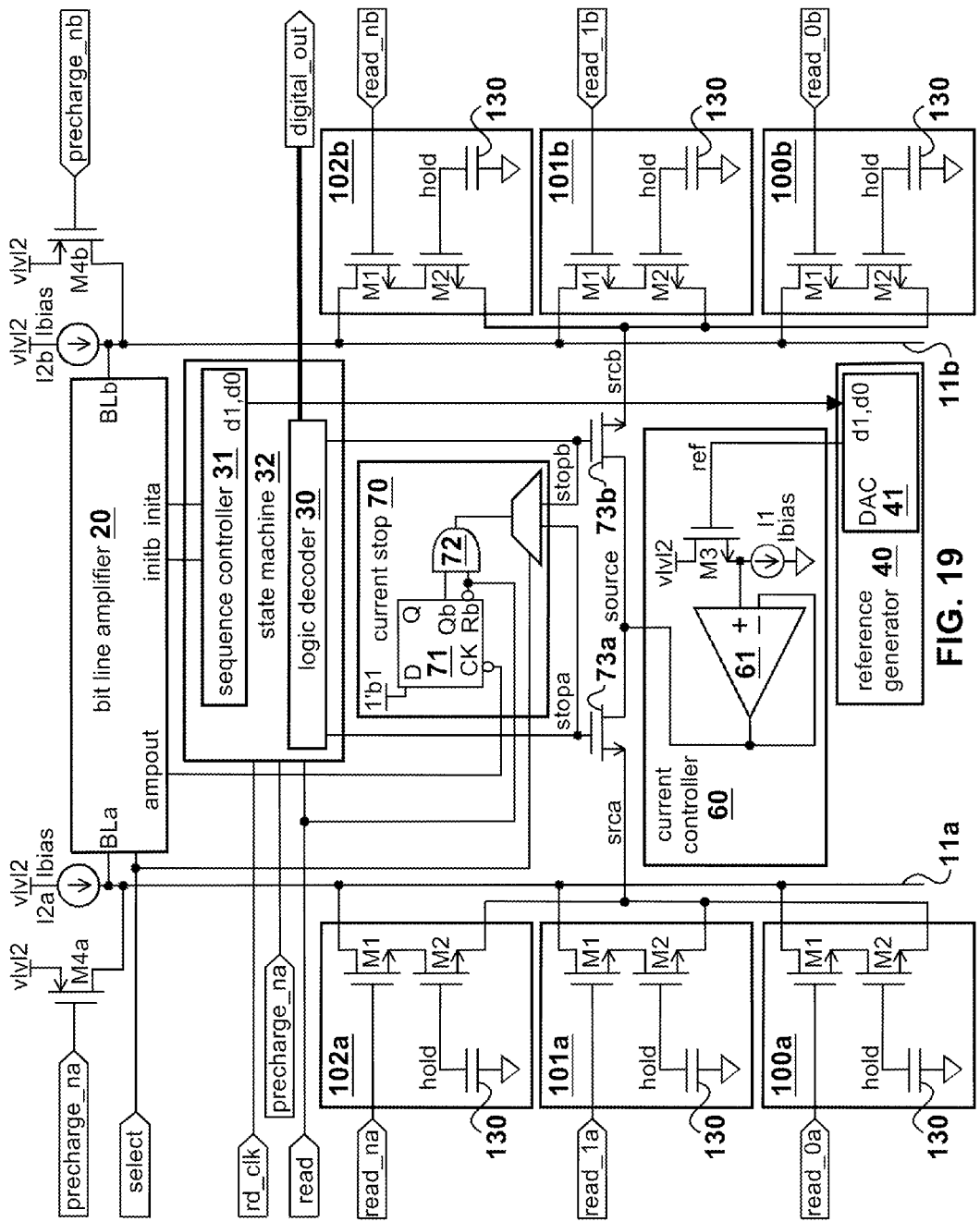
FIG. 19 is a schematic drawing depicting an array of bits cells.

FIG. 19 teaches the concept of the current controller with the opamp driving a plurality of bit cells in an array. Three bit cells 100a, 101a, and 101b are shown tied to the read bit line 11a and three bit cells 100b, 101b, and 102b are shown tied to the read bit line 11b with a common source node tied to the output of the opamp 61 through the current stop switch transistors 73a and 73b. A single bit line amplifier 20 is shared for the two read bit lines 11a and 11b. Only one of the bit lines 11a or 11b is active at a time and one and only one bit cell is read from at a time for a given read bit line.

FIG. 19 illustrates a subsection of a RAM memory architecture. Such a memory architecture will comprise a plurality of memory bit cells, at least one read bit line, and at least one current controller wherein the memory bit cells each comprise two transistors and one capacitor, and each current controller has a transistor and an opamp. The voltage of a read bit line is controlled and changed by a current from a current controller where the current is flowing in at least one transistor in the memory bit cell and each memory bit cell is electrically connected to a read bit line. The current is determined by a function independent of a threshold voltage of any of the transistors. In each bit cell the storage capacitor 130 is a holding capacitor as a storage element and said hold node transistor, M2, senses the voltage of the holding capacitor, wherein the voltage represents a value of stored information. The other transistor in the bit cell, M1, is a read transistor as a switch to activate a read-out of the memory bit cell. The transistor in the current controller, the reference transistor M3, is a source follower to buffer a desired reference voltage level, and the opamp 61 in the current controller buffers the voltage from the reference transistor. Each read bit line has a precharge transistor that has the purpose of clamping the read bit line to a voltage vlvl2 when it is turned on and allowing the read bit line to float or be controlled by the hold node transistor when it is not turned on. There are two current sources, one of either I2a or I2b, which sources a bias current of value Ibias into its respective read bit line and the other, 11, supplies bias current to the reference transistor. The memory architecture of FIG. 19 further comprises a peripheral circuitry to activate and to drive the memory architecture. The peripheral circuitry comprises a set of precharge_n inputs, a set of read inputs, the reference generator 40, and a voltage source with a value of vlvl2 for this embodiment.

In many other embodiments that are not pictured, the bit cells using a modified differential pair embodiment will be in an array consisting of n+1 rows by 2*(k+1) columns of bit cells. Each column of bit cells will also have a write bit line and a read bit line. Each bit cell will have a write transistor connecting the write bit line to the hold node of each bit cell with the write transistor gate tied to a write signal. Only one row of bit cells will be written to or read from at a time. During a read, one read signal will be asserted per row of memory bit cells and will enable the reading of that row. During a memory write, one write signal will be asserted at a time and will cause the writing to the hold nodes on that row. The drains of the read transistors will be tied together for each column of bit cells. A p-channel transistor will supply the bias current to each column of read bit lines and will act as a bias current source. The write transistors for each column will also be tied together. The reference voltage will go through a source follower into an opamp thereby driving all of the sources of the hold node transistors in a plurality of the bit cells.

While the invention is susceptible to various modifications and alternative forms, specific embodiments thereof are shown by way of example in the drawings and described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

The invention claimed is:

1. A memory architecture comprising at least one memory bit cell and at least one read bit line whose voltage is controlled and changed by a current from a current controller; wherein each of said at least one memory bit cell comprises a storage mechanism, a controlled current source and a read switch; wherein said controlled current source is electrically connected to one of said at least one read bit line through said read switch, and said current from said current controller flows through said controlled current source; and wherein said current is equal to a quantity that is a difference function of a difference between a stored voltage on said storage mechanism and a reference voltage from a reference voltage input to said current controller.

2. The memory architecture of claim 1, wherein each of said at least one read bit line has a read bit line signal and a parasitic capacitance, said storage mechanism has a storage capacitance, and wherein said read bit line signal is independent of a ratio of said parasitic capacitance to said storage capacitance of said storage mechanism.

3. The memory architecture of claim 1, wherein said reference voltage can be varied and is not fixed.

4. The memory architecture of claim 1, wherein said difference function is independent of a threshold voltage of any transistor.

5. The memory architecture of claim 3, wherein said memory architecture further comprises a reference generator and said reference voltage can be varied by said reference generator.

6. The memory architecture of claim 5, wherein said current controller comprises a reference transistor in a source follower configuration.

7. The memory architecture of claim 6, wherein said reference transistor has a reference transistor output buffered by an opamp in a unity gain configuration.

8. The memory architecture of claim 7, wherein said reference voltage has a plurality of predetermined reference values wherein said reference voltage has one and only one of said plurality of predetermined reference values at a time.

9. The memory architecture of claim 8, wherein said stored voltage has a value that represents a BASE4 value.

10. The memory architecture of claim 8, wherein said reference voltage is provided in a sequence of said reference voltage such that one and only one of said plurality of predetermined reference values is applied at a time, whereby an algorithm is used to monitor a read bit line change in voltage of said at least one read bit line as said reference voltage is sequenced and compared to said stored voltage on said storage mechanism of said at least one memory bit cell.

11. The memory architecture of claim 10 wherein said memory architecture further comprises a sequence controller supplying a digital signal to a digital to analog converter that converts said digital signal to said reference voltage.

12. The memory architecture of claim 10, further comprising
at least one bit line amplifier that transforms said read bit line change in voltage on said at least one read bit line to a binary value outputted onto a wire distinct from said at least one read bit line, wherein a bit line amplifier output of said at least one bit line amplifier is an amplifier function of said difference function; and
a state machine that controls a reference change of said reference voltage and evaluates said bit line amplifier output of said at least one bit line amplifier to determine a voltage value stored on said storage mechanism using said algorithm to monitor said read bit line change in voltage as said reference voltage is provided in said sequence of said reference voltage and compared to said stored voltage on said storage mechanism.

13. The memory architecture of claim 12, wherein the memory architecture further comprises a clamp voltage source providing a clamp voltage and at least two read bit lines and wherein said at least one bit line amplifier is shared between two of said at least two read bit lines and comprises a differential bit line amplifier that operates on a bit line difference between a read bit line voltage of each of said two of said at least two read bit lines; wherein each of said two of said at least two read bit lines has a first read bit line that is active and a second read bit line that is inactive, wherein said second read bit line that is inactive is clamped to said clamp voltage, and for each of said two of said at least two read bit lines, one and only one said at least one memory bit cell is read from at a time.

14. The memory architecture of claim 13, wherein said at least one bit line amplifier comprises:
a latch having a pair of NMOS transistors that are cross-coupled;
a pair of switches that initialize a state of said latch;
a pair of inputs from said two of said at least two read bit lines;
a pair of latch current sources that change said state of said latch as an input differential function of said bit line difference wherein said bit line difference is a difference between an amplifier input voltage on each of said pair of inputs; and
a pair of inverters that invert a drain of each of said pair of NMOS transistors, wherein each inverter output of said pair of inverters is distinct from said two of said at least two read bit lines and derives its value from said state of said latch such that when said input differential function reaches a predetermined threshold value, said state of said latch changes and when said input differential function is less than said predetermined threshold value, said state of said latch does not change.

15. The memory architecture of claim 12, wherein said state machine has a sequence controller and a logic decoder.

16. The memory architecture of claim 15, wherein said sequence controller controls a voltage step sequence of said reference voltage, wherein said voltage step sequence comprises a set of step voltages, wherein a value of each step voltage of said set of step voltages of said voltage step sequence is determined with a digital to analog converter that converts a digital signal from said sequence controller such that said step voltage is supplied as said reference voltage to said reference voltage input to said current controller.

17. The memory architecture of claim 16, wherein said voltage step sequence of said reference voltage is applied sequentially such that one and only one of said step voltage from said set of step voltages is applied at a time.

18. The memory architecture of claim 17 wherein said logic decoder uses said algorithm to monitor said read bit line change in voltage in said at least one read bit line as said reference voltage is sequenced by said sequence controller and compared to said stored voltage of said storage mechanism by said current controller to produce monitoring results that said algorithm uses to decode a digital value that represents a value of said stored voltage on said storage mechanism.

19. A RAM memory architecture comprising a plurality of memory bit cells, at least one read bit line and at least one current controller wherein each of said plurality of memory bit cells comprises two bit cell transistors and one capacitor, and each of said at least one current controller has a current controller transistor and an opamp, wherein a read bit line voltage of each of said at least one read bit line is controlled and changed by a current from one of said at least one current controller, wherein said current is flowing in at least one of said two bit cell transistors and each of said plurality of memory bit cells is electrically connected to one of said at least one read bit line, wherein said current is determined by a function independent of a threshold voltage of any of said two bit cell transistors and said current controller transistor.

20. The RAM memory architecture of claim 19, wherein said capacitor is a holding capacitor acting as a storage element, a first of said two bit cell transistors is a hold node transistor that senses a voltage of said holding capacitor that represents a value of stored information, and a second of said two bit cell transistors is a read transistor functioning as a switch to activate a read-out of one of said plurality of memory bit cells.

21. The RAM memory architecture of claim 19, wherein said current controller transistor is a reference transistor as a source follower to buffer a reference voltage input, and said opamp buffers a source follower voltage from said reference transistor.

22. The RAM memory architecture of claim 19, further comprising at least one set of two current sources having a first and a second current source, wherein each said first current source supplies current to each of said at least one read bit line and each said second current source supplies bias current to each of said current controller transistor.

23. The RAM memory architecture of claim 19, wherein each of said at least one read bit line has a precharge transistor and a precharge voltage source with a precharge voltage wherein said precharge transistor has the purpose of clamping one of said at least one read bit line to said precharge voltage when said precharge transistor is turned on, and has no effect on said read bit line voltage when said precharge transistor is turned off.

24. The RAM memory architecture of claim 19 further comprising a peripheral circuitry to activate and to drive said memory architecture, wherein said peripheral circuitry comprises a set of precharge_n inputs, a set of read inputs, a reference generator, and at least one bias voltage source.

25. The RAM memory architecture of claim 20, wherein said voltage of said holding capacitor has one of four voltage levels.

26. A method for executing a read operation in a RAM memory architecture having at least one memory bit cell and at least one read bit line operatively connected thereto, the method comprising a step of:
- supplying a reference voltage input that generates a reference voltage;
- supplying a current controller that controls a voltage change on said at least one read bit line;
- supplying a controlled current source in each of said at least one memory bit cell having a current controlled by said current controller;
- supplying a storage mechanism in each of said at least one memory bit cell that stores a stored voltage;
- comparing said reference voltage from said reference voltage input to said stored voltage of said storage mechanism in said at least one memory bit cell;
- calculating a quantity that is a function of a difference between said stored voltage and said reference voltage; and
- setting said current in said controlled current source such that said current is set to be equal to said quantity.

27. The method for executing a read operation in a RAM memory architecture of claim 26, wherein the method further comprises a step of:
- providing a holding capacitor, four transistors, an opamp, a current source, a clamp voltage source, and a peripheral circuitry to activate and to drive said memory architecture;
- deploying said holding capacitor as said storage mechanism in each of said at least one memory bit cell;
- deploying a first of said four transistors as a hold node transistor in each of said at least one memory bit cell that functions as said controlled current source controlled by said current controller, wherein said hold node transistor also senses a voltage of said holding capacitor which represents a value of stored information;
- deploying a second of said four transistors as a read transistor in each of said at least one memory bit cell that functions as a switch to activate a read-out of the memory bit cell;
- deploying a third of said four transistors as a reference transistor in said current controller that functions as a source follower to buffer said reference voltage from said reference voltage input and produces a reference transistor output voltage;
- deploying said opamp to buffer said reference transistor output voltage, wherein said reference transistor and said opamp form said current controller;
- deploying said clamp voltage source to provide a clamp voltage;
- deploying a fourth of said four transistors as a precharge transistor that functions as a clamping transistor to hold each of said at least one read bit line to said clamp voltage when it is in an on condition and has no effect when it is in an off condition; and
- deploying said current source to support said read operation of said at least one memory bit cell.

28. The method for executing a read operation in a RAM memory architecture of claim 26, wherein the method further comprises a step of stopping the current in said controlled current source when said voltage change on said at least one read bit line is greater than a predetermined threshold such that a magnitude of a voltage transition on said at least one read bit line is decreased, thereby reducing read cycle power consumption.

29. The method for executing a read operation in a RAM memory architecture of claim 26, wherein the method further comprises a step of:
- providing an indicator for indicating when to stop said current in said controlled current source, said indicator having an on and an off condition;
- providing a switch for stopping said current in said controlled current source when said indicator is activated in the on condition; and
- stopping said current in said controlled current source when said voltage change on said at least one read bit line is greater than a predetermined threshold, thereby reducing read cycle power consumption.

30. The method for executing a read operation in a RAM memory architecture of claim 27, wherein said controlled current source comprises an NMOS hold node transistor.

31. A memory architecture comprising at least one memory bit cell and at least one read bit line wherein a voltage of said at least one read bit line is controlled and changed by a current in a transistor inside said at least one memory bit cell wherein each of said at least one memory bit cell is electrically connected to one of said at least one read bit line, wherein said current in said transistor is stopped by an indicator wherein said indicator responds to an indication that a voltage change on said at least one read bit line is greater than a predetermined threshold.

32. A memory architecture comprising
- at least one memory bit cell,
- at least one read bit line, wherein a voltage of said at least one read bit line is controlled and changed by a current in a transistor inside said at least one memory bit cell wherein each of said at least one memory bit cell is electrically connected to one of said at least one read bit line,
- an indicator for indicating when to stop said current in said transistor wherein said indicator has an on and an off condition,
- a switch for stopping said current in said transistor when said indicator is activated in the on condition such that said current in said transistor is stopped when a voltage change on said at least one read bit line is greater than a predetermined threshold.

33. A RAM memory architecture comprising a plurality of memory bit cells arranged in a plurality of arrays having read bit lines and current controllers, and said memory architecture also having a peripheral circuitry wherein said plurality of memory bit cells each comprise:
- a holding capacitor as a storage element;
- a hold node transistor that senses a voltage of said holding capacitor, wherein said voltage of said holding capacitor represents a value of stored information; and
- a read transistor that functions as a switch to activate a read-out of the memory bit cell;

said read bit lines each comprise:
- a clamp voltage source with a clamp voltage;
- a precharge transistor that functions as a clamp to hold said read bit lines to said clamp voltage when said precharge transistor is turned on and allows said read bit lines to float or be controlled by a current in said hold node transistor when said precharge transistor is turned off; and
- a current source that supports a read operation out of each of said plurality of memory bit cells;

said current controllers each comprise:
a reference transistor that functions as a source follower to buffer a desired voltage level from a reference voltage input source; and an opamp that buffers a voltage from said reference transistor; and said peripheral circuitry activates and drives each of said plurality of arrays;

wherein:

said reference voltage input source generates a reference voltage that is compared to a stored voltage on said holding capacitor in each of said plurality of memory bit cells;

a quantity that is a function of a difference between said stored voltage and said reference voltage is calculated by said current controller such that said current in said hold node transistor that controls a voltage change on one of said read bit lines is set to be equal to said quantity; and said current is stopped when said voltage change on one of said read bit lines is greater than a predetermined threshold such that a magnitude of a voltage transition on said one of said read bit lines is decreased thereby reducing read cycle power consumption.

34. The memory architecture of claim 33, wherein at least one of said plurality of arrays comprises an array of n+1 rows by 2*(k+1) columns of said plurality of memory bit cells having a write bit line for each of said 2*(k+1) columns and one of said read bit lines for each of said 2*(k+1) columns, wherein each of said plurality of memory bit cells has a write transistor connecting said write bit line to a hold node gate of said hold node transistor and said write transistor has a write gate connected to a write input wherein said write input has a write signal, only one row of said n+1 rows of said plurality of memory bit cells of said at least one of said plurality of arrays is written to or read from at a time, during a read operation, there is a read signal asserted per said one row of said n+1 rows and said read signal enables the reading of said one row of said n+1 rows, during a memory write operation, there is one of said write signal asserted per said one row of said n+1 rows and said write signal causes the writing to said hold node gate in at least one of said plurality of memory bit cells on said one row of said n+1 rows, a p-channel transistor supplies a bias current as said current source to one of said read bit lines for each of said 2*(k+1) columns of said plurality of memory bit cells, in each of said 2*(k+1) columns the drains of all of each said read transistor in said one of said 2*(k+1) columns of said plurality of memory bit cells are connected together, in each of said 2*(k+1) columns all of each said write transistor in said one of said 2*(k+1) columns of said plurality of memory bit cells are connected together, and said reference voltage goes through said reference transistor and said opamp and then drives said hold node transistor source in at least one of said plurality of memory bit cells.

35. A memory architecture having a standard differential pair comprising at least one memory bit cell and at least one read bit line whose voltage is controlled and changed by a current in a hold node transistor, wherein said current is determined by a function of a difference between a voltage of said at least one memory bit cell and a reference voltage from a reference voltage input comprising:

a read transistor having a read transistor gate, a read transistor source and a read transistor drain wherein said read transistor gate is connected to a read input, said read transistor source is connected to a hold node drain of said hold node transistor, and said read transistor drain is connected to said at least one read bit line and a current source with a bias value of Ibias, said hold node transistor has a hold node gate, a hold node source and said hold node drain with said hold node gate connected to a storage capacitor, said hold node source connected to a reference transistor source of a reference transistor, and said hold node drain connected to said read transistor source, said reference transistor having a reference transistor gate, said reference transistor source and a reference transistor drain with said reference transistor gate connected to said reference voltage input, said reference transistor source connected to said hold node source and a tail current with a bias value of two times Ibias, and said reference transistor drain connected to a voltage source, and a precharge transistor having a precharge transistor gate, a precharge transistor source and a precharge transistor drain with said precharge transistor gate connected to a precharge_n input, said precharge transistor source connected to said voltage source, and said precharge transistor drain connected to said at least one read bit line.

36. A memory architecture having a modified differential pair comprising at least one memory bit cell and at least one read bit line whose voltage is controlled and changed by a current in a hold node transistor, wherein said current is determined by a function of a difference between a voltage of said at least one memory bit cell and a reference voltage from a reference voltage input, the memory architecture comprising:

a first current source with a first bias current value of Ibias, a second current source with a second bias current value of Ibias, a storage capacitor, a read transistor having a read transistor gate, a read transistor source and a read transistor drain wherein said read transistor gate is connected to a read input, said read transistor source is connected to a hold node drain of said hold node transistor, and said read transistor drain is connected to said at least one read bit line and said first current source, an opamp in a unity gain configuration and having an output and a positive input, wherein said hold node transistor has a hold node gate connected to said storage capacitor, has a hold node source connected to said output of said opamp, and said hold node drain connected to said read transistor source, a voltage source, a reference transistor having a reference transistor gate, a reference transistor source and a reference transistor drain wherein said reference transistor gate is connected to said reference voltage input, said reference transistor source is connected to said positive input of said opamp and said second current source, and said reference transistor drain is connected to said voltage source, and a precharge transistor having a precharge transistor gate, a precharge transistor source and a precharge transistor drain wherein said precharge transistor gate is connected to a precharge_n input, said precharge transistor source is connected to said voltage source, and said precharge transistor drain is connected to said at least one read bit line.

37. The memory architecture of claim 36, wherein said precharge transistor, said reference transistor, and said opamp are shared with a plurality of said at least one memory bit cell.

38. The memory architecture of claim 36, wherein all said reference transistors, said read transistors, said hold node transistors and said precharge transistors comprise PMOS transistors or NMOS transistors.

39. The memory architecture of claim 36, whereby a non-destructive read is performed by isolating said storage capacitor from said at least one read bit line.

40. A memory architecture comprising at least one parallel mode memory bit cell and a plurality of read bit lines wherein each of said plurality of read bit lines has a voltage that is controlled and changed by a current from one current controller in a set of current controllers; wherein each of said at least one parallel mode memory bit cell comprises one and only one shared storage capacitor that is shared with a plurality of hold node transistors and a plurality of read transistors;

each of said plurality of hold node transistors is electrically connected to one of said plurality of read bit lines through one of said plurality of read transistors;

said shared storage capacitor has a shared stored voltage having one of a plurality of predetermined shared stored values representing a plurality of digital bits;

each of said plurality of hold node transistors has current flowing through it from said one current controller in said set of current controllers;

each said one current controller in said set of current controllers has a reference voltage input with a reference voltage having one and only one of a plurality of predetermined current controller values; and said current flowing through each of said plurality of hold node transistors is equal to a parallel mode current quantity that is a function of a difference between said shared stored voltage on said one and only one shared storage capacitor and said reference voltage input to a corresponding said one current controller in said set of current controllers.

* * * * *